United States Patent
Um et al.

(10) Patent No.: US 10,483,098 B2
(45) Date of Patent: Nov. 19, 2019

(54) DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Dongbin Um, Yongin-si (KR); Jihong Hwang, Yongin-si (KR); Hayoung Choi, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 30 days.

(21) Appl. No.: 15/585,357

(22) Filed: May 3, 2017

(65) Prior Publication Data
US 2017/0323779 A1    Nov. 9, 2017

(30) Foreign Application Priority Data
May 3, 2016 (KR) .................. 10-2016-0054692

(51) Int. Cl.
| H01L 21/02 | (2006.01) |
| H01L 51/00 | (2006.01) |
| G02F 1/1337 | (2006.01) |
| H01L 27/12 | (2006.01) |
| G02F 1/1333 | (2006.01) |
| G02F 1/1345 | (2006.01) |

(52) U.S. Cl.
CPC .... *H01L 21/02107* (2013.01); *G02F 1/13454* (2013.01); *G02F 1/133305* (2013.01); *G02F 1/133711* (2013.01); *H01L 21/02112* (2013.01); *H01L 27/1218* (2013.01); *H01L 27/1262* (2013.01); *H01L 51/0097* (2013.01); *G02F 2201/50* (2013.01); *H01L 27/1214* (2013.01)

(58) Field of Classification Search
CPC .......... G02F 1/133305; G02F 2201/50; G02F 1/13454; G02F 1/133711; H01L 51/0097; H01L 2251/5338; H01L 51/5253; H01L 21/02107; H01L 2227/323
See application file for complete search history.

(56) References Cited

U.S. PATENT DOCUMENTS

| 9,130,192 B2 | 9/2015 | Kim et al. |
| 9,214,640 B2 | 12/2015 | Lee et al. |
| 9,274,559 B2 | 3/2016 | Prushinskiy et al. |

(Continued)

FOREIGN PATENT DOCUMENTS

| KR | 1020130076402 | 7/2013 |
| KR | 1020140085956 | 7/2014 |

(Continued)

*Primary Examiner* — Jia X Pan
(74) *Attorney, Agent, or Firm* — F. Chau & Associates, LLC

(57) ABSTRACT

A method of manufacturing a display apparatus is provided as follows. A substrate having a display portion on an upper surface of the substrate is prepared. A protection film having an opening is attached to a lower surface of the substrate so that the protection film overlaps the display portion. A support film is attached to the lower surface so that the support film is disposed within the opening of the protection film. A driving circuit chip is attached to the upper surface so that the driving chip is spaced apart from the display portion and the opening. At least a part of the support film is removed. The substrate is bent along a longitudinal direction of the opening.

21 Claims, 31 Drawing Sheets

(56) References Cited

U.S. PATENT DOCUMENTS

| | | | |
|---|---|---|---|
| 2013/0169515 A1* | 7/2013 | Prushinskiy | G06F 1/1652 345/55 |
| 2014/0092338 A1* | 4/2014 | Miyazaki | G02F 1/13452 349/58 |
| 2014/0152646 A1* | 6/2014 | Kang | G09G 3/2085 345/214 |
| 2014/0183473 A1* | 7/2014 | Lee | H01L 51/0097 257/40 |
| 2015/0014644 A1* | 1/2015 | Namkung | H01L 51/0097 257/40 |
| 2015/0049428 A1* | 2/2015 | Lee | G06F 1/1652 361/679.27 |
| 2015/0277376 A1 | 10/2015 | Wu-Lu et al. | |
| 2016/0014883 A1 | 1/2016 | Cho et al. | |
| 2016/0181346 A1* | 6/2016 | Kwon | H01L 27/3276 257/40 |
| 2016/0275830 A1* | 9/2016 | You | G06F 3/041 |
| 2017/0062760 A1* | 3/2017 | Kim | H01L 51/5253 |
| 2017/0179423 A1* | 6/2017 | Kwon | H01L 27/323 |
| 2017/0250237 A1* | 8/2017 | Cheng | H01L 51/0097 |
| 2017/0263887 A1* | 9/2017 | Han | H01L 27/3276 |
| 2017/0271616 A1* | 9/2017 | Choi | H01L 51/5253 |
| 2018/0090702 A1* | 3/2018 | Um | H01L 51/56 |
| 2018/0175323 A1* | 6/2018 | Ahn | H01L 51/5253 |

FOREIGN PATENT DOCUMENTS

| | | |
|---|---|---|
| KR | 1020140108914 | 9/2014 |
| KR | 1020150044080 | 4/2015 |

* cited by examiner

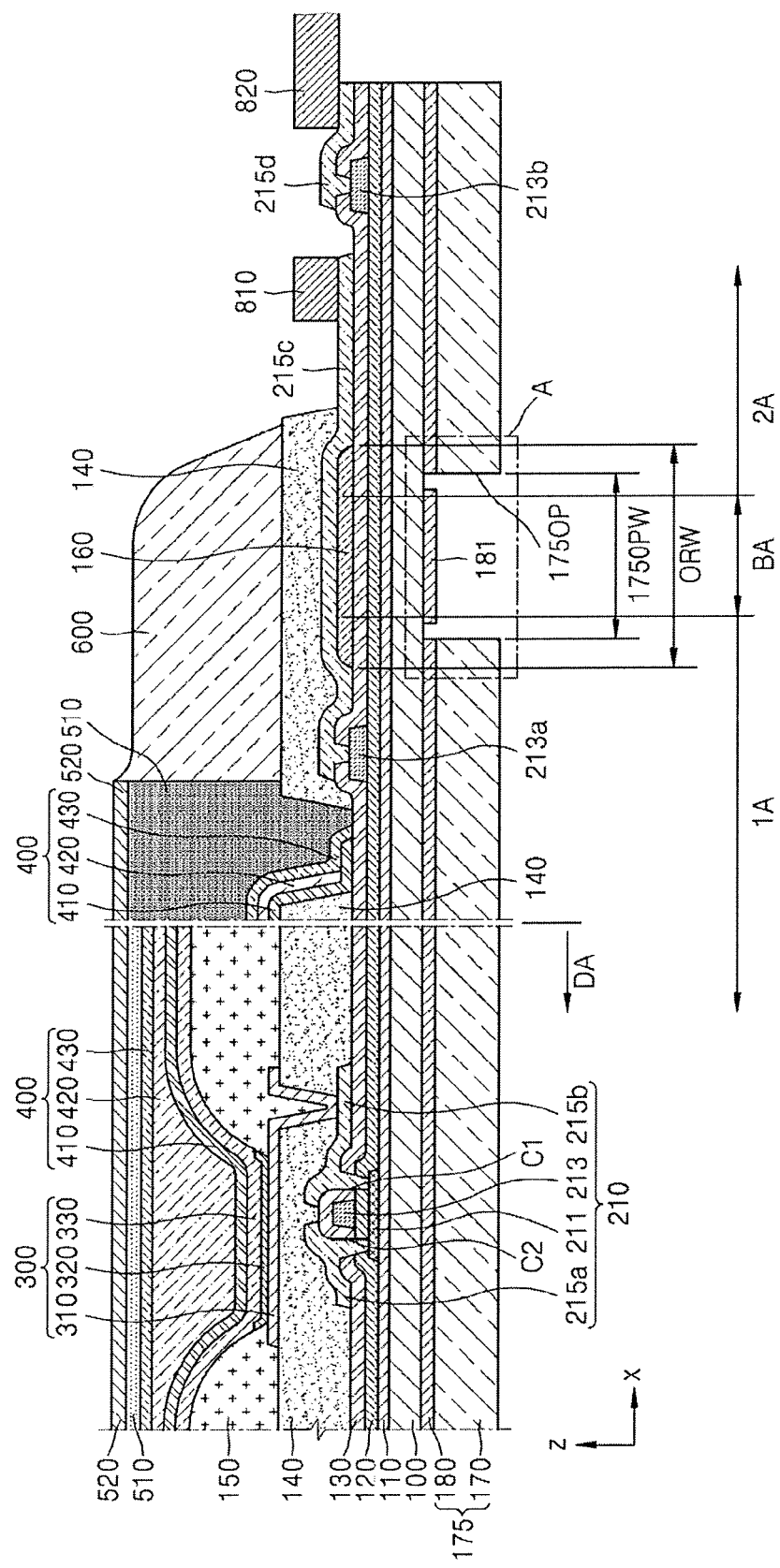

FIG. 15.B
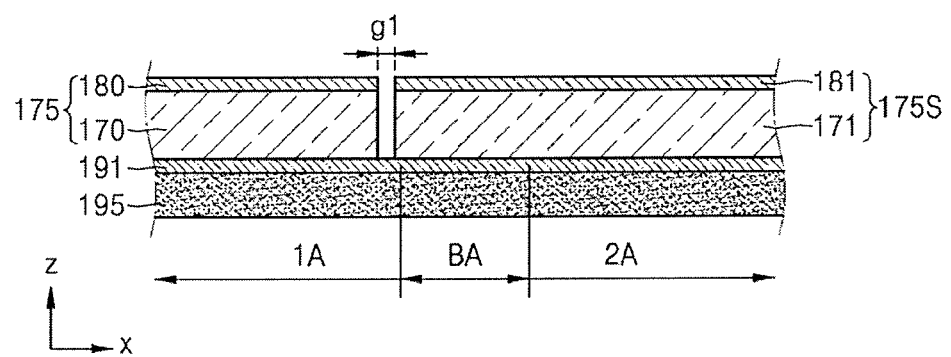

DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2016-0054692, filed on May 3, 2016, in the Korean Intellectual Property Office, the disclosure of which is incorporated by reference herein in its entirety.

TECHNICAL FIELD

The present invention relates to a display apparatus and a method of manufacturing the same.

DISCUSSION OF RELATED ART

Display apparatuses include a substrate divided into a display area and a non-display area. In the display area, gate lines and data lines are insulated from each other and pixel areas are defined by the gate lines and the data lines that cross one another. Thin film transistors (TFTs) and pixel electrodes provided in the in the in the pixel areas in the display area are electrically connected to one another. Various conductive layers such as wirings transmitting electrical signals to the display area are provided in the display area.

SUMMARY

According to an exemplary embodiment of the present invention, a method of manufacturing a display apparatus is provided as follows. A substrate having a display portion on an upper surface of the substrate is prepared. A protection film having an opening is attached to a lower surface of the substrate so that the protection film overlaps the display portion. A support film is attached to the lower surface so that the support film is disposed within the opening of the protection film. A driving circuit chip is attached to the upper surface so that the driving chip is spaced apart from the display portion and the opening. At least a part of the support film is removed. The substrate is bent along a longitudinal direction of the opening.

According to an exemplary embodiment of the present invention, a display apparatus is provided as follows. A substrate having a first area, a second area and a bending area between the first area and the second area is provided. The bending area is bent to have a curved lower surface. A display portion is disposed on an upper surface of the first area of the substrate. A protection film is disposed on a lower surface of the first area of the substrate and comprises a protection film base and a first adhesive layer. A second adhesive layer is disposed on the curved lower surface of the bending area of the substrate. A hardness of the second adhesive layer is higher than a hardness of the first adhesive layer. The protection film has an opening exposing the curved lower surface of the bending area of the substrate.

According to an exemplary embodiment of the present invention, a method of manufacturing a display apparatus is provided as follows. A substrate having a display portion on an upper surface of the substrate is prepared. A protection film having an opening is attached to a lower surface of the substrate so that the protection film overlaps the display portion. The protection film comprises a protection film base and a first adhesive layer. A support film is attached to the lower surface so that the support film is disposed within the opening of the protection film. The support film comprises a support film base and a second adhesive layer. A driving circuit chip is attached to the upper surface of the substrate so that the driving chip is spaced apart from the display portion and the opening. The support film is removed to expose the second adhesive layer so that the second adhesive layer is exposed through the opening of the protection film. The substrate is bent along a longitudinal direction of the opening so that the substrate has a curved surface overlapping the opening of the protection film. A first hardening process is performed on the exposed second adhesive layer.

BRIEF DESCRIPTION OF DRAWINGS

These and other features of the present invention will become more apparent by describing in detail exemplary embodiments thereof with reference to the accompanying drawings of which:

FIGS. 2B, 2C, 2D, 3, 4A, 4B, 5, 6, 7, 8, 9A, 9B, 9C, 10, 11 and 12 are schematic cross-sectional views for describing processes of manufacturing the display apparatus of FIG. 1;

DETAILED DESCRIPTION OF EXEMPLARY EMBODIMENTS

Figure 1:
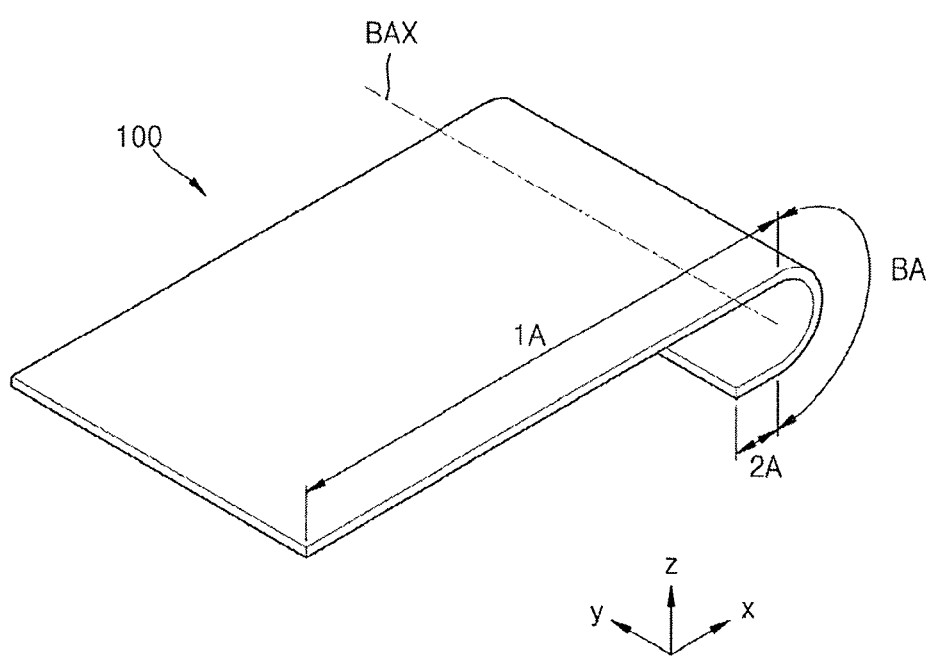
FIG. 1 is a schematic perspective view partially showing a display apparatus according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Sizes of components in the drawings may be exaggerated for convenience of explanation. In other words, since sizes and thicknesses of components in the drawings are arbitrarily illustrated for convenience of explanation, the present invention is not limited thereto.

In the following examples, the x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

A display apparatus is an apparatus displaying images, for example, a liquid crystal display apparatus, an electrophoretic display apparatus, an organic light-emitting display apparatus, an inorganic light-emitting display apparatus, a field emission display apparatus, a surface-conduction electron-emitter display apparatus, a plasma display apparatus, a cathode ray display apparatus, or the like.

Hereinafter, the organic light-emitting display apparatus will be described as an example of a display apparatus according to an embodiment. However, the display apparatus according to the present inventive concept is not limited thereto and may include various types of display apparatus.

FIG. 1 is a schematic perspective view partially showing a display apparatus according to an exemplary embodiment. The display apparatus includes a substrate 100 that are partially bent as shown in FIG. 1.

The substrate 100 of the display apparatus includes a bending area BA extending in a first direction (a+y direction). The bending area BA is located between a first area 1A and a second area 2A, in a second direction (a+x direction) crossing the first direction. The substrate 100 is bent with respect to a bending axis BAX extending in the first direction (the +y direction). The substrate 100 may include various materials having flexible or bendable characteristics, for example, a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), or cellulose acetate propionate (CAP). The substrate 100 may have a single-layer or multi-layer structure. The present invention is not limited thereto. For example, the substrate 100 may have variously modified structures such as a structure in which a resin layer including a resin and a barrier layer including an inorganic material such as silicon oxide or silicon nitride are alternately stacked, a structure further including an intermediate layer including amorphous silicon between the resin layer and the barrier layer, etc.

The bending area BA has a curved surface along the bending axis BAX. For example, the bending area BA has a curved lower surface along the bending axis BAX.

Figure 2A:
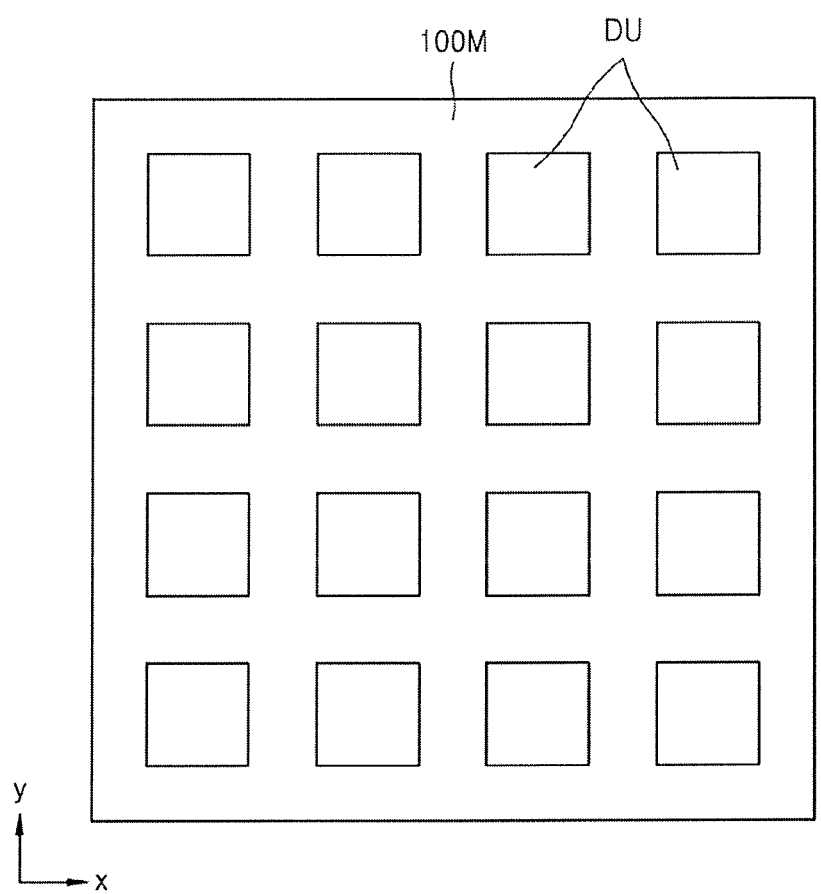
FIG. 2A is a plan view illustrating a mother substrate of a display apparatus according to an exemplary embodiment of the present invention.

FIG. 2A is a plan view illustrating a mother substrate of a display apparatus according to an exemplary embodiment of the present invention. FIGS. 2B, 2C, 2D, 3, 4A, 4B, 5, 6, 7, 8, 9A, 9B, 9C, 10, 11 and 12 are schematic cross-sectional views for describing processes of manufacturing the display apparatus of FIG. 1.

As shown in FIG. 2A, a plurality of display portions DU is formed on an upper surface of a mother substrate 100M. Other processes may be performed before the plurality of display portions DU are formed. For example, a process of forming a buffer layer on an entire surface of the mother substrate 100M, etc. may be performed. In addition, when the plurality of display portions DU is formed, electronic devices such as thin film transistors that may be electrically connected to display devices, etc. may also be formed. The electronic devices may also be formed in peripheral areas outside a display area in which display devices are positioned. When the plurality of display portions DU is formed, an encapsulation layer for protecting display devices may also be formed. A detailed configuration of the display portion DU will be described below.

Figure 2B:
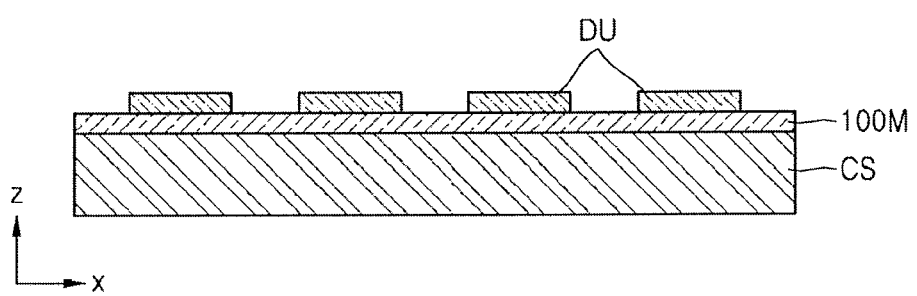

When the plurality of display portions DU is formed as shown in FIG. 2A, the plurality of display portions DU may be formed on the mother substrate 100M. The mother substrate 100M is positioned on a carrier substrate CS as shown in FIG. 2B. The carrier substrate CS may include, for example, glass having a sufficient thickness to support the mother substrate 100 in the manufacturing process of the display apparatus of FIG. 1. The carrier substrate CS may have a sufficient hardness to prevent the mother substrate 100M including a flexible or bendable characteristic from being bent or deformed during the manufacturing process of the display apparatus of FIG. 1. For example, the mother substrate 100M may be formed on the carrier substrate CS having the sufficient hardness, and the plurality of display portions DU may be formed on the mother substrate 100M.

Figure 2C:
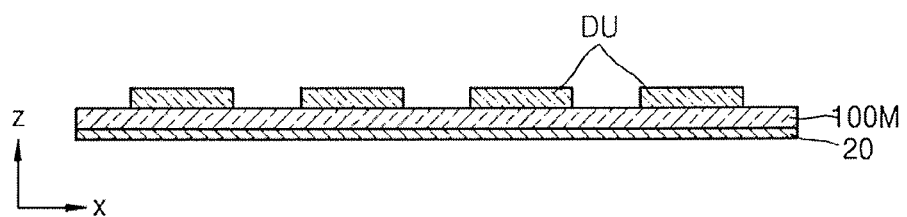

After the display portions DU are formed as described above, the mother substrate 100M is separated from the carrier substrate CS and as shown in FIG. 2C, a temporary protection film 20 is attached to a lower surface of the mother substrate 100M from which the carrier substrate CS is separated in a z direction. The temporary protection film 20 may serve to prevent the lower surface of the mother substrate 100M from being damaged during the manufacturing process of the display apparatus of FIG. 1. The temporary protection film 20 may be removed during the manufacturing process as will be described below, and thus adhesion between the temporary protection film 20 and the mother substrate 100M need not be strong.

Figure 2D:
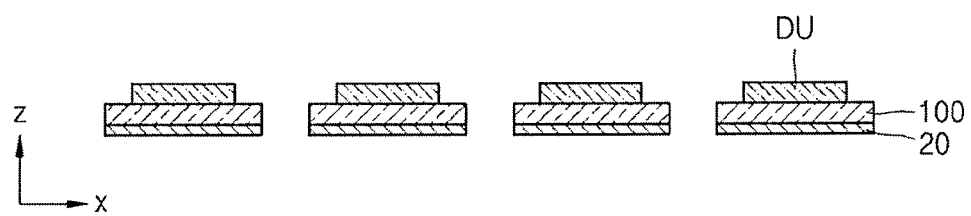

After the temporary protection film 20 is attached to the lower surface of the mother substrate 100M, the mother substrate 100M and the temporary protection film 20 may be simultaneously cut. For example, the mother substrate 100M and the temporary protection film 20 may be cut so that each of the plurality of display portions DU is separated from each other. In this case, the mother substrate 100M is separated into a plurality of substrates 100 as shown in FIG. 2D. Each of the display portions DU may form a display panel and thus a plurality of display panels may be obtained through the cutting operation of the temporary protection film 20 and the substrate 100M. The mother substrate 100M and the temporary protection film 20 may be cut using various methods, for example, by irradiating a laser beam on the mother substrate 100M and/or the temporary protection film 20 or by placing a cutting wheel in contact with the mother substrate 100M and/or the temporary protection film 20.

Figure 3:
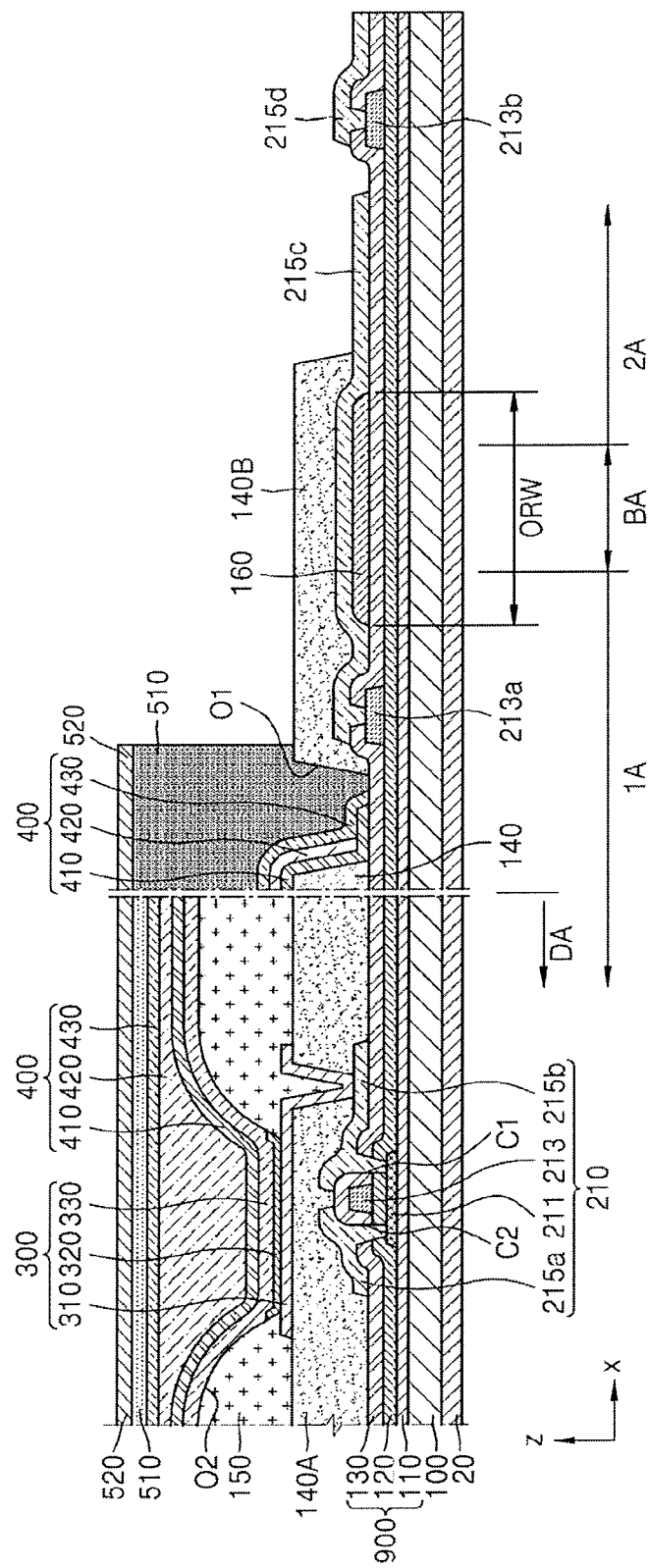

FIG. 3 is a schematic cross-sectional view of a part of one of a plurality of display panels obtained through the cutting operation described above.

The first area 1A of the substrate 100 includes a display area DA. The first area 1A also includes a part of a non-display area outside the display area DA as shown in FIG. 3. The second area 2A includes the non-display area. A display portion including a display device such as an organic light-emitting diode (OLED) 300 or a thin film transistor (TFT) 210, etc. is in the first area 1A. The display portion may include elements disposed within the display area DA and may also include elements belonging to the first area 1A and disposed inside the non-display area. The substrate 100 includes the bending area BA between the first area 1A and the second area 2A. The substrate 100 may be bent in the bending area BA afterward and may have the shape illustrated in FIG. 1.

A plurality of pixels may be disposed in the display area DA of the display panel so that an image may be displayed. The display area DA may include devices such as the display device such as the OLED 300, the TFT 210, and a capacitor, etc. The display area DA may further include signal wirings such as a gate line for transferring a gate signal, a data line for transferring a data signal, a driving power line for supplying power, a common power line, etc. A pixel may be formed by electrically coupling the TFT 210, the capacitor, the display device such as the OLED 300, etc. that are connected to the gate line, the data line, and the driving power line so that an image may be displayed. The pixel may emit light with brightness corresponding to a driving current passing through the OLED 300 in response to the data signal according to driving power and common power supplied to the pixel. A plurality of pixels may be configured and disposed in various ways, such as a stripe layout, a PenTile layout, etc.

A configuration in which the OLED 300 is electrically connected to the TFT 210 may be construed as a configuration in which a pixel electrode 310 is electrically connected to the TFT 210. A TFT (not shown) may also be disposed in a peripheral area outside the display area DA of the substrate 100 when needed. The TFT disposed in the peripheral area may be, for example, a part of a circuit portion for controlling an electric signal applied to the display area DA.

The TFT 210 may include a semiconductor layer 211, a gate electrode 213, a source electrode 215a, and a drain electrode 215b. The semiconductor layer 211 may include amorphous silicon, polycrystalline silicon, an oxide semiconductor, or an organic semiconductor material The gate electrode 213 may be connected to a gate wiring (not shown) for sending on and off signals are to the TFT 210. The gate electrode 213 may include a low-resistive conductive material. For example, the gate electrode 213 may be a single layer or a multilayer including a conductive material including, for example, molybdenum (Mo), aluminum (Al), copper (Cu), titanium (Ti) or a combination thereof.

Each of the source electrode 215a and the drain electrode 215b may be a single layer or a multilayer including a conductive material having high conductivity. The source electrode 215a and the drain electrode 215b may be respectively connected to a source area and a drain area of the semiconductor layer 211. For example, each of the source electrode 215a and the drain electrode 215b may be a single layer or a multilayer including a conductive material including, for example, Al, Cu, Ti or a combination thereof.

The source electrode 215a and the drain electrode 215b may be connected to the semiconductor layer 211 via contact holes C1 and C2. The contact holes C1 and C2 may be formed by simultaneously etching an interlayer insulating layer 130 and a gate insulating layer 120.

The TFT 210 is a top gate type TFT in which the gate electrode 213 is disposed on an upper surface of the semiconductor layer 211. The upper surface of the semiconductor layer 211 faces toward the OLED 300. The present invention is not limited thereto. For example, the TFT 210 may be a bottom gate type TFT in which the gate electrode 213 is disposed on a bottom surface of the semiconductor layer 211. The bottom surface of the semiconductor layer 211 faces toward the substrate 100.

To obtain an insulating property between the semiconductor layer 211 and the gate electrode 213, the gate insulating layer 120 may include an inorganic material such as silicon oxide, silicon nitride, silicon oxynitride or a combination thereof. The gate insulating layer 120 may be disposed between the semiconductor layer 211 and the gate electrode 213. In addition, the interlayer insulating layer 130 including an inorganic material such as silicon oxide, silicon nitride, silicon oxynitride or a combination thereof may be disposed on the gate electrode 213. The source electrode 215a and the drain electrode 215b may be disposed on the interlayer insulating layer 130. The insulating layer including the inorganic material described above may be formed by a chemical vapor deposition (CVD) process or an atomic layer deposition (ALD) process. The same applies to the embodiments described below and modifications thereof.

A buffer layer 110 including an inorganic material such as silicon oxide, silicon nitride, silicon oxynitride or a combination thereof may be disposed between the TFT 210 having the above structure and the substrate 100. The buffer layer 110 may have a single-layer or multi-layer structure. The buffer layer 110 may increase smoothness of an upper surface of the substrate 100. The buffer layer 110 may also serve to prevent or minimize infiltration of impurities from the substrate 100, etc. into the semiconductor layer 211 of the TFT 210.

A planarization layer 140 may be disposed on the TFT 210. For example, when the OLED 300 is disposed on the TFT 210 as shown in FIG. 3, the planarization layer 140 may cover the TFT 210, providing a planarized surface for manufacturing the OLED 300 on the TFT 210. The planarization layer 140 may include an organic material, for example, benzocyclobutene (BCB) or hexamethyldisiloxane (HMDSO). The planarization layer 140 of FIG. 3 has a single-layered structure. The present invention is not limited thereto. For example, the planarization layer 140 may have variously modified structures such as a multi-layered structure.

The planarization layer 140 has an opening O1 outside the display area DA so that a portion of the planarization layer 140 within the display area DA and a portion of the planarization layer 140 outside the display area DA are physically separated from each other through the opening O1. For example, the planarization layer 140 includes an inner planarization layer 140A disposed within the display area DA and an outer planarization layer 140B disposed outside the display area DA. The inner planarization layer 140A and the outer planarization layer 140B are separated from each other by the opening O1 which is interposed between the inner and outer planarization layers 140A and 140B.

Thus, impurities from the outer planarization layer 140B may be prevented from infiltrating the display area DA by the opening O1. The outer planarization layer 140B is partially disposed with the second area 2A.

In the display area DA of the substrate 100, the OLED 300 including a pixel electrode 310, an opposite electrode 330, and an intermediate layer 320 disposed between the pixel electrode 310 and the opposite electrode 330. The intermediate layer 320 may include an emission layer. The OLED 300 is positioned on the planarization layer 140. The pixel electrode 310 may be electrically connected to the TFT 210 by contacting one of the source electrode 215a and the drain electrode 215b via an opening formed in the inner planarization layer 140A.

A pixel defining layer 150 may be disposed on the planarization layer 140. The pixel defining layer 150 may have an opening O2 corresponding to each of sub-pixels. For example, the opening O2 of the pixel defining layer 150 exposes at least a center portion of the pixel electrode 310 to define a pixel. The pixel defining layer 150 may increase a distance between an edge of the pixel electrode 310 and the opposite electrode 330 above the pixel electrode 310 to prevent an electric arc from being generated from an end portion 310E of the pixel electrode 310. For example, the opening O2 of the pixel defining layer 150 increases upwardly so that the distance between the end portion 310E of the pixel electrode 310 and the opposite electrode 330 increase upwardly along the opposite electrode 330. The pixel defining layer 150 may include, for example, an organic material such as PI or HMDSO.

The intermediate layer 320 of the OLED 300 may include a low-molecular weight material or a polymer material. When the intermediate layer 320 includes the low-molecular weight material, the intermediate layer 320 may have a single or multiple-layered structure including a hole injection layer (HIL), a hole transport layer (HTL), an emission layer (EML), an electron transport layer (ETL), and an electron injection layer (EIL) and may include various organic materials including copper phthalocyanine (CuPc), N,N'-Di(naphthalene-1-yl)-N,N'-diphenyl-benzidine (NPB), and tris-8-hydroxyquinoline aluminum ($Alq_3$). The layers may be formed by using a vacuum deposition method.

When the intermediate layer 320 includes the polymer material, the intermediate layer 320 may have a structure including an HTL and an EML. In this regard, the HTL may include Poly(3,4-ethylenedioxythiphene):poly(4-styrenesulfonate) (PEDOT:PSS), and the EML may include a polymer material such as a poly-phenylenevinylene (PPV)-based material and a polyfluorene-based material. The intermediate layer 320 may be formed using a screen printing method, an inkjet printing method, a laser induced thermal imaging (LITI) method, or the like.

The present invention is not limited thereto. For example, the intermediate layer 320 may include a layer that is continuously formed on a plurality of pixel electrodes 310 or a layer that is patterned to correspond to each of the plurality of pixel electrodes 310.

The opposite electrode 330 may be disposed on the display area DA, covering the display area DA. The opposite electrode 330 may be continuously formed in a plurality of OLEDs and thus may overlap the plurality of pixel electrodes 310.

Since the OLED 300 may be easily damaged by external moisture or oxygen, an encapsulation layer 400 covers and protects the OLED 300. The encapsulation layer 400 covers the display area DA and extend to the outside of the display area DA. The encapsulation layer 400 may include a first inorganic encapsulation layer 410, an organic encapsulation layer 420, and a second inorganic encapsulation layer 430.

The first inorganic encapsulation layer 410 covers the opposite electrode 330. The first inorganic encapsulation layer 410 may include silicon oxide, silicon nitride, silicon oxynitride or a combination thereof. Other layers such as a capping layer may be disposed between the first inorganic encapsulation layer 410 and the opposite electrode 330. Since the first inorganic encapsulation layer 410 is conformally formed on the opposite electrode 330, an upper surface of the first inorganic encapsulation layer 410 need not be flat as shown in FIG. 3. The organic encapsulation layer 420 covers the first inorganic encapsulation layer 410. Unlike the first inorganic encapsulation layer 410, an upper surface of the organic encapsulation layer 420 is flat. For example, the organic encapsulation layer 420 has a flat upper surface at a portion corresponding to the display area DA. For example, the organic encapsulation layer 420 fills the opening of the pixel defining layer 150. The organic encapsulation layer 420 may include PET, PEN, PC, PI, polyethylene sulfonate, polyoxymethylene, PAR, or HMDSO.

The second inorganic encapsulation layer 430 is disposed on the organic encapsulating layer 420, covering the organic encapsulation layer 420. The second inorganic encapsulation layer 430 may include silicon oxide, silicon nitride, silicon oxynitride or a combination thereof. In an exemplary embodiment, an edge of the second inorganic encapsulation layer 430 outside the display area DA may contact the first inorganic encapsulation layer 410 so that the organic encapsulation layer 420 is not exposed to the outside.

Since the encapsulation layer 400 includes the first inorganic encapsulation layer 410, the organic encapsulation layer 420, and the second inorganic encapsulation layer 430, a crack created in the encapsulation layer 400 need not propagate between the first inorganic encapsulation layer 410 and the organic encapsulation layer 420 or between the organic encapsulation layer 420 and the second inorganic encapsulation layer 430. Accordingly, formation of a path through which external moisture or oxygen infiltrates into the display area DA may be prevented or minimized. The formation of the path may be formed when the crack is propagated through the encapsulation layer 400.

A polarization plate 520 is attached to the encapsulation layer 400 by using an optically clear adhesive (OCA) 510. The polarization plate 520 may reduce reflection of external light. For example, when the external light having passed through the polarization plate 520 is reflected from an upper surface of the opposite electrode 330 and then passes through the polarization plate 520 again, a phase of the reflected external light may be changed as the incoming external light passes through the polarization plate 520 twice. As a result, a phase of reflected external light may be different from the phase of the incoming external light entering the polarization plate 520 to the extent that a destructive interference occurs, and accordingly, the reflection of external light may be reduced to increase visibility. The OCA 510 and the polarization plate 520 may cover the opening O2 of the planarization layer 140. The present invention is not limited thereto. For example, the polarization plate 520 may be omitted or other configurations of the polarization plate 520 may be used. For example, if the polarization plate 520 is omitted, a black matrix and a color filter may serve to reduce the reflection of incoming external light.

A process of forming a touch electrode of various patterns for a touch screen function or a touch protection layer for protecting the touch electrode over the encapsulation layer 400 may be further performed.

The buffer layer 110, the gate insulating layer 120, and the interlayer insulating layer 130, all of which include an inorganic insulating material, may be referred to as an inorganic insulating layer 900. For example, the inorganic insulating layer may include silicon oxide or silicon nitride. FIG. 3, the inorganic insulating layer may have a flat upper surface which overlaps an organic material layer 160 that will be described below.

The display apparatus includes a first conductive layer 215c disposed on the inorganic insulating layer. The first conductive layer 215c is disposed on the first area 1A, the second area 2A and the bending area BA. The first conductive layer 215c may serve as a wiring via which an electrical signal is transmitted to the display area DA. The first conductive layer 215c may be formed simultaneously with the source electrode 215a or the drain electrode 215b by using the same material as a material of the source electrode 215a or the drain electrode 215b.

The display apparatus includes the organic material layer 160. The organic material layer 160 is disposed between the interlayer insulating layer 130 and the first conductive layer 215c and may overlap with the bending area BA. The interlayer insulating layer 130 may include an inorganic insulating material. The organic material layer 160 may buffer or absorb a tensile stress created when the substrate 100 and the inorganic insulating layer 900 are bent through the bending area BA. The tensile stress transferred to the first conductive layer 215c is minimized.

A stacked structure of the first conductive layer 215c, the organic material layer 160 and the inorganic insulating layer 900 is formed on the bending area BA. For example, the first conductive layer 215c, the organic material layer 160 and the inorganic insulating layer 900 are stacked on each other in the listed order to prevent a crack from propagating to OLED 300, for example.

Without the organic material layer 160, the first conductive layer 215c is in contact with the inorganic insulating layer 900. The tensile stress created when the substrate 100 is bent may be, without being reduced by the organic material layer 160, applied to the first conductive layer 215c. The inorganic insulating layer 900 has a higher hardness than a hardness of the organic material layer 160, and accordingly, a crack is more likely to occur and propagate in the inorganic insulating layer 900 in the bending area BA. When a crack occurs in the inorganic insulating layer 900, the crack may propagate into the first conductive layer 215c. Accordingly, a defect such as a disconnection in the first conductive layer 215c may occur due to the crack in the first conductive layer 215c.

According to an exemplary embodiment, such crack propagation into the first conductive layer 215c due to the bent of the substrate 100 may be prevented by using the organic material layer 160 interposed between the first conductive layer 215c and the inorganic insulating layer 900 in the bending area BA. The organic material layer 160 may serve to buffer or absorb the tensile stress which is generated when the substrate 100 and the inorganic insulating layer 900 are bent. The tensile stress transferred to the first conductive layer 215c may be minimized by the organic material layer 160. Accordingly, the occurrence of a crack in a portion of the first conductive layer 215c that corresponds to the bending area BA, wherein the first conductive layer 215c is positioned on the organic material layer 160, may be prevented or minimized.

The organic material layer 160 overlaps the bending area BA, covering a portion of a non-bending area. For example, the organic material layer 160 having a predetermined width ORW is formed on the inorganic insulating layer, covering the bending area BA. For example, the organic material layer 160 completely covers the bending area BA. In this case, the width ORW of the organic material layer 160 is greater than a width of the bending area BA. A thickness of a portion of the organic material layer 160 that overlaps with the bending area BA may be greater than a thickness of a non-overlapping area thereof. The thickness difference may be set considering the stress generated due to the bending. The organic material layer 160 may include PI, acryl, BCB, HMDSO or a combination thereof.

The display apparatus further includes second conductive layers 213a and 213b and a third conductive layer 215d. The third conductive layer 215d may be disposed in the same layer level as a layer of the first conductive layer 215c. The second conductive layers 213a and 213b are disposed in the first area 1A and the second area 2A, respectively. The second conductive layers 213a and 213b are located at a different layer level from a layer of the first conductive layer 215c. The second conductive layers 213a and 213b may be electrically connected to the first conductive layer 215c or the third conductive layer 215d.

The second conductive layers 213a and 213b may be located at the same layer level as a layer of the gate electrode 213 of the TFT 210. For example, the second conductive layers 213 and 213b are in contact with the gate insulating layer 120 and include the same material as a material of the gate electrode 213. The first conductive layer 215c may contact the second conductive layer 213a disposed in the first area 1A via a contact hole formed in the interlayer insulating layer 130. The third conductive layer 215d is connected to the second conductive layer 213b located in the second area 2A. The first conductive layer 215c is connected to the second conductive layer 213a located in the first area 1A.

The second conductive layer 213a located in the first area 1A may be electrically connected to a TFT in the display area DA, and thus, the first conductive layer 215c may be electrically connected to the TFT in the display area DA via the second conductive layer 213a. The second conductive layer 213b located in the second area 2A may also be electrically connected to the TFT in the display area DA. As described above, the second conductive layers 213a and 213b located outside the display area DA may be electrically connected to components located in the display area DA. The present invention is not limited thereto. The second conductive layers 213a and 213b may extend toward the display area DA so as to be located at least partially in the display area DA.

The first conductive layer 215c that extends across the bending area BA may include a material having a elongation rate to the extent that the occurrence of a crack in the first conductive layer 215c or a defect such as a disconnection in the first conductive layer 215c may be prevented.

The second conductive layers 213a and 213b may include a material having a lower elongation rate than an elongation rate of the first conductive layer 215c and electrical/physical characteristics different from electrical/physical characteristics of the first conductive layer 215c. The second conductive layers 213a and 213b may be formed in the first area 1A and the second area 2A, respectively. Accordingly, efficiency of transmitting an electrical signal in the display apparatus may increase, or a defect rate during the manufacturing processes may be reduced. For example, the second conductive layers 213a and 213b may include molybdenum, and the first conductive layer 215c may include aluminum. The first conductive layer 215c and the second conductive layers 213a and 213b may have multi-layered structures.

The first conductive layer 215c and the third conductive layer 215d may be simultaneously formed when the source electrode 215a and the drain electrode 215b are formed. The second conductive layers 213a and 213b may be simultaneously formed when the gate electrode 213 is formed.

The temporary protection film 20 may be removed before a protection film 175 and a support film 175S that will be described below are attached to a lower surface (−z direction) of the substrate 100. The temporary protection film 20 may be configured as an adhesive and a temporary protection film base so that the temporary protection film base may be attached to the lower surface of the substrate 100 by using the adhesive. Thus, when the temporary protection film 20 is removed from the substrate 100, the temporary protection film 20 may be wholly removed, and the adhesive may partially remain.

Figure 4A:
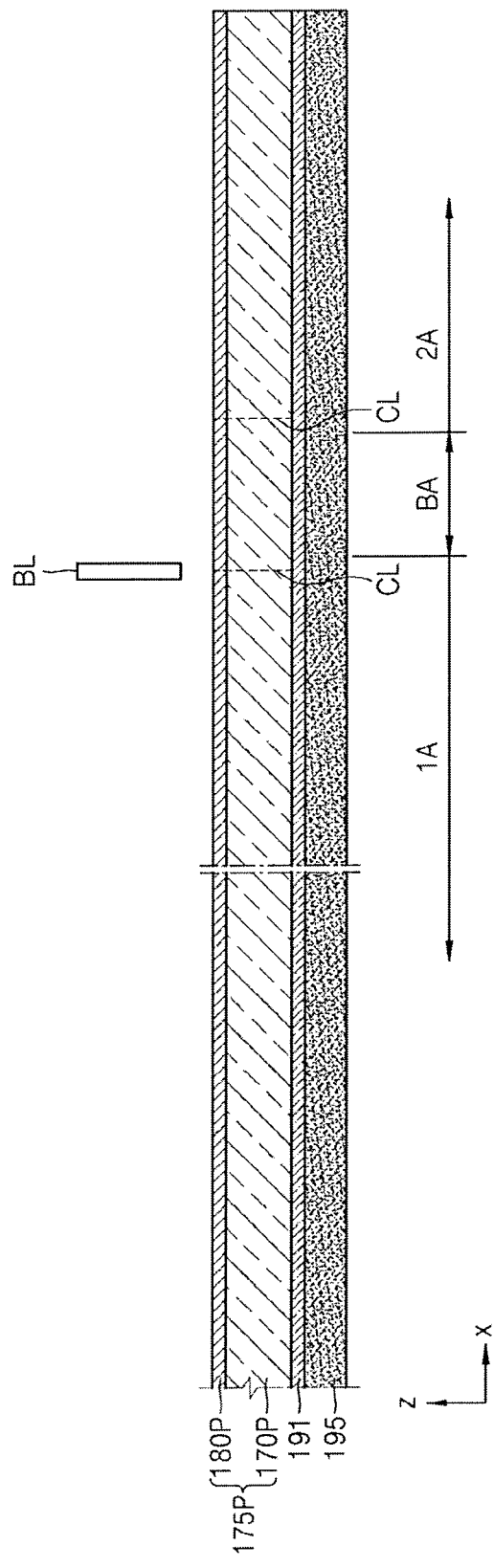
Figure 4B:
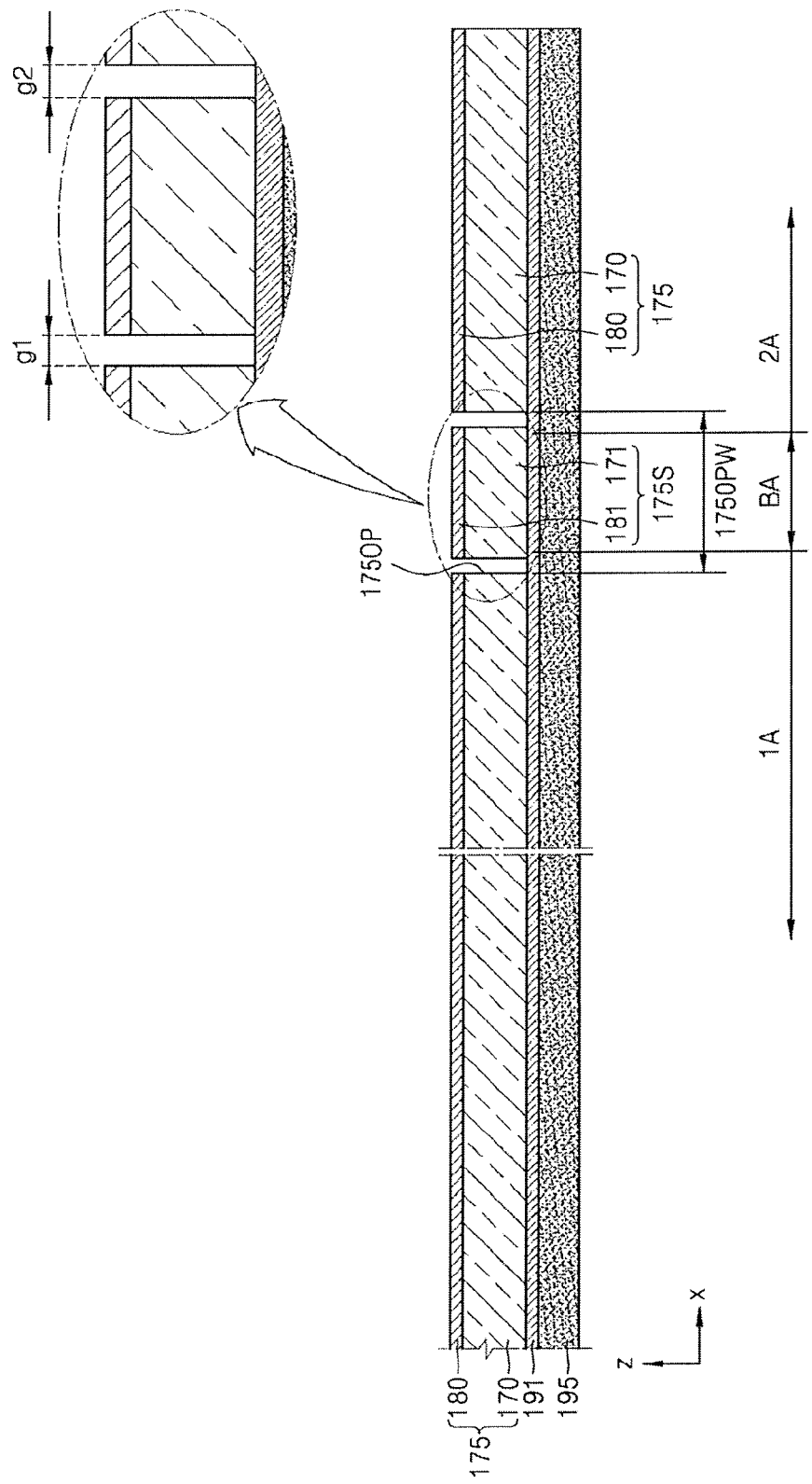

As shown in FIGS. 4A and 4B, the protection film 175 and the support film 175S are prepared. The protection film 175 and the support film 175S are supported by a lower film 195. The protection film 175 and the support film 175S may be attached to one surface of the substrate 100. The support film 175S may be attached to the bending area BA of the substrate 100. According to an exemplary embodiment, the support film 175S and the protection film 175 may be formed of different materials from each other.

FIGS. 4A and 4B illustrate a method of manufacturing the protection film 175 and the support film 175S according to an exemplary embodiment. Referring to FIG. 4A, a preparatory protection film 175p may be formed on the lower film 195. For example, the preparatory protection film 175p may be attached to the lower film 195 by using a third adhesive layer 191. The preparatory protection film 175p may include a preparatory protection film base 170p and a preparatory adhesive layer 180p. A protection film (not shown) may be further formed on the preparatory adhesive layer 180p to protect the preparatory adhesive layer 180p during a manufacturing procedure.

The preparatory protection film 175p formed on the lower film 195 may be cut along a cutting line CL by using a blade BL and/or laser. As shown in FIG. 4B, the preparatory protection film 175p is separated into the protection film 175 and the support film 175S. Since the preparatory protection film 175p is cut, the protection film 175 includes an opening 175OP. The support film 175S is disposed in the opening 175OP. The support film 175S is spaced apart from sidewalls of the opening 175OP at predetermined gaps g1 and g2. The gaps g1 and g2 may be determined by a width of the blade BL or a laser beam. For example, the gaps g1 and g2 may range from several micrometer (um) to several tens um. The support film 175S may be attached to the bending area BA of the substrate 100 later. An area of the support film 175S and an area of the opening 175OP may be greater than an area of the bending area BA. For example, a width 175OPW of the opening 175OP is greater than a width of the bending area BA in FIG. 4.

The opening 175OP may be extended along the y-axis in parallel to the bending axis BAX of FIG. 1. For example, the opening 175OP may be extended along the opening's longitudinal direction (y-axis, for example).

Since the preparatory protection film 175p is cut, the protection film 175 includes a protection film base 170 and a first adhesive layer 180, and the support film 175S includes a support film base 171 and a second adhesive layer 181. The support film 175S may include the same material as a material of the protection film 175. The protection film base 170 and the support film base 171 may be attached to a lower surface of the substrate 100 by using the first adhesive layer 180 and the second adhesive layer 181, respectively.

The protection film base 170 and the support film base 171 may include PET (Polyethylene terephtahalate) or PI (Polymide), PMMA (Poly(methyl methacrylate)) or PC (Polycarbonate). According to an exemplary embodiment, the protection film base 170 and the support film base 171 may be formed of different materials. The first adhesive layer 180 and the second adhesive layer 181 may include a pressure sensitive adhesive (PSA). The PSA may include acrylics, silicon rubbers, butyl rubber, ethylene-vinyl acetate or styrene block copolymers. The first adhesive layer 180 and the second adhesive layer 181 may include different properties. For example, the first adhesive layer 180 and the second adhesive layer 181 may be different in adhesion, hardness, and/or colors, etc. To make the first adhesive layer 180 and the second adhesive layer 181 have different properties, a hardening process may be performed on the second adhesive layer 181. The hardening process may use an ultraviolet (UV) rays, a laser beam or a heat treatment. Hereinafter, the hardening process performed on the second adhesive layer 181 may be referred to as a first hardening process.

The preparatory adhesive layer 180p is formed and then separated into the first adhesive layer 180 and the second adhesive layer 181. The present invention is not limited thereto. For example, the protection film base 170 and the support film base 171 may be formed on the lower film 195 and then the first adhesive layer 180 and the second adhesive layer 181 may be individually formed on the protection film base 170 and the support film base 171, respectively. In this case, the first adhesive layer 180 and the second adhesive layer 181 may also have different properties.

The preparatory protection film 175p is cut by the blade BL and is separated into the protection film 175 and the support film 175S. The present invention is not limited to. For example, the preparatory protection film 175p may be cut by a laser or a combination of a blade cutting process and a laser cutting process. The preparatory protection film 175p may also be separated into the protection film 175 and the support film 175S by using an etching process.

Figure 5:
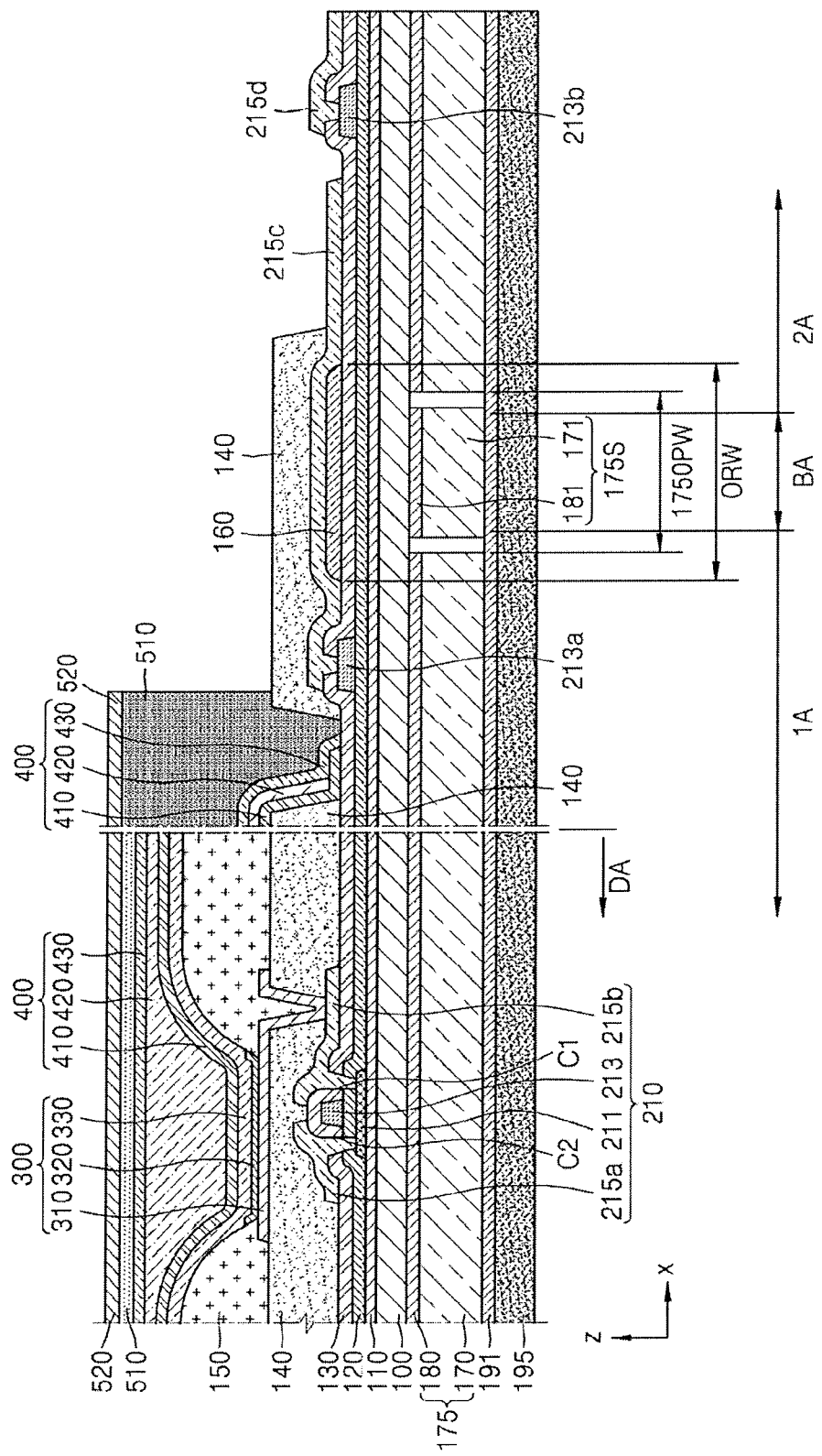

The protection film 175 and the support film 175S are supported by the lower film 195 as shown in FIG. 5. In this case, the temporary protection film 20 attached to the lower surface of the substrate 100 of the display panel may be removed and then the protection film 175 and the support film 175S may be attached. The lower surface of the substrate 100 is a surface in an opposite direction (a −z direction) to a direction (a +z direction) in which a display portion is to be positioned.

The protection film 175 and the support film 175S are attached to the lower surface of the substrate 100. The lower film 195 is attached to the protection film 175 and the support film 175S using the third adhesive layer 191. An attaching process described above may be performed by pressing a lower surface of the lower film 195 in a direction (+z direction) of an upper surface of the substrate 100 by using a roller, etc. The protection film 175 and the support film 175S may be respectively attached to the lower surface of the substrate 100 by the first adhesive layer 180 and the second adhesive layer 181. As described above, the support film 175S is attached to the bending area BA of the substrate 100.

Figure 6:
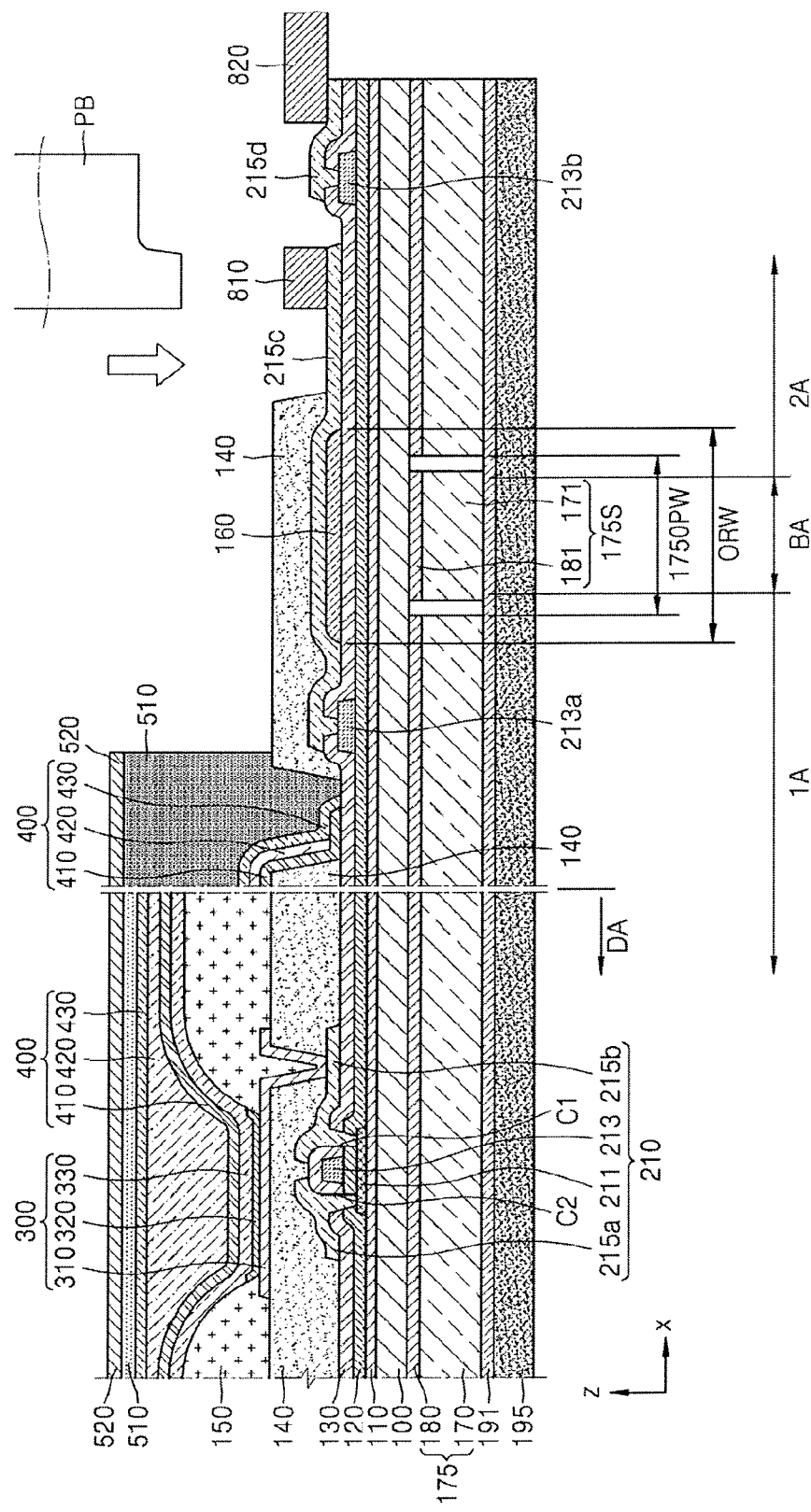

In FIG. 6, the protection film 175 and the support film 175S are respectively attached to the lower surface of the substrate 100 via the lower film 195. A driving circuit chip 810 and/or a printed circuit board (PCB) 820 may be attached to the second area 2A. The driving circuit chip 810 and/or the PCB 820 may be connected to the first conductive layer 215c, the second conductive layer 213b, and the third conductive layer 215d that are disposed in the second area 2A and/or other conductive layers electrically connected to the first conductive layer 215c, the second conductive layer 213b, and the third conductive layer 215d. The driving circuit chip 810 and/or the PCB 820 may provide driving signals to the display area DA through the above conductive layers. The driving signals may represent various signals driving the display apparatus such as a driving voltage, a gate signal, a data signal, etc. The driving circuit chip 810 is mounted in an end of the first conductive layer 215c, and the PCB 820 is connected to an edge of the third conductive layer 215d. The present invention is not limited thereto. For example, the driving circuit chip 810 and the PCB 820 may be connected to the second conductive layer 213b or other conductive layers.

The driving circuit chip 810 and/or the PCB 820 may be attached to the above conductive layers by applying pressure and heat thereto by a pressure bonding apparatus PB. In this case, an anisotropic conducting film (ACF) may be used as an adhesive for the driving circuit chip 810 and/or the PCB 820. The ACF may include an adhesive agent cured by heat. The AFC may be configured as a double-sided tape including fine conducting particles containing the adhesive agent. The fine conducting particles are mixed and distributed in the double-sided tape. Thus, if pressure is applied to upper and lower portions of the ACF, the fine conducting particles may burst and the adhesive agent in the fine conducting particles may cover the double-sided tape so that the ACF may simultaneously have conductive and adhesive properties.

The support film 175S may serve to minimize deformation of the substrate 100 during a process of bonding the driving circuit chip 810 and/or the PCB 820. During the bonding process, a heat treatment may be applied so that without the support film 175S, the substrate 100 may droop in the direction (−z direction) in which the display portion is not disposed. If the drooped substrate 100 is hardened with the temperature cooled down, the drooped substrate 100 may have a curvature to the extent that a crack occurs in the bending area BA in a bending process later. If a bending protection layer (BPL) 600 that will be described below is formed on the drooped substrate 100, the thickness of the BPL 600 may be ununiform, and thus the radius of curvature need not be uniformly formed and a crack occurs in the bending area BA when the substrate 100 is bent.

The support film 175S is attached to the lower surface of the substrate 100 in the bending area BA, thereby preventing or minimizing drooping of the substrate 100 in the process of bonding the driving circuit chip 810 and/or the PCB 820.

Figure 7:
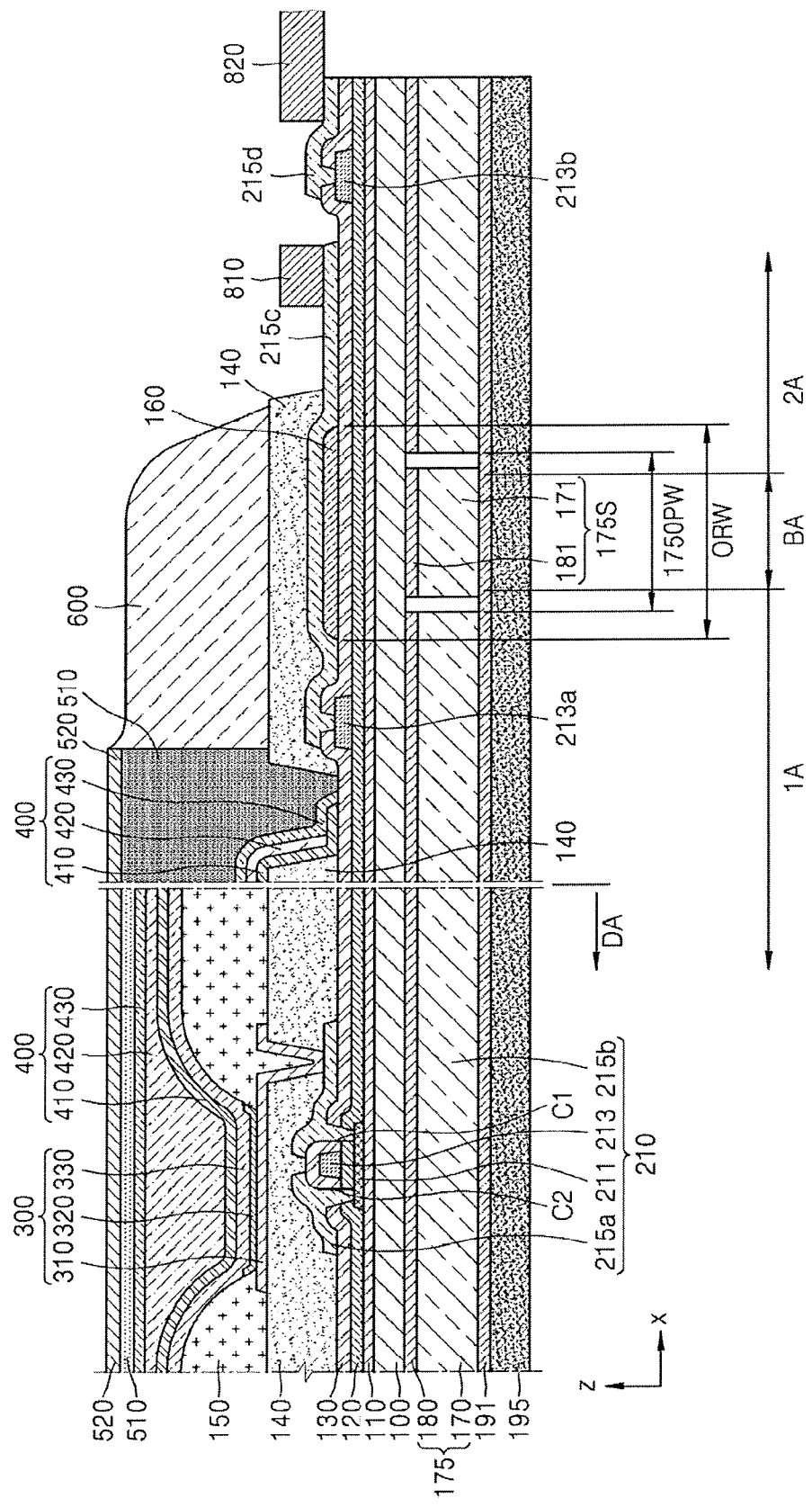

Referring to FIG. 7, the BPL 600 is formed on an upper surface of the substrate 100, overlapping the bending area BA. The BPL 600 may be formed after the process of bonding the driving circuit chip 810 and/or the PCB 820 is performed. The present invention is not limited thereto. For example, the BPL 600 may be formed before the process of bonding the driving circuit chip 810 and/or the PCB 820 is performed.

The BPL 600 is formed on a portion of the first conductive layer 215c. The portion of the first conductive layer 215c overlaps the bending area BA. When the stack structure of FIG. 7 is bent, there is a stress neutral plane in the stack structure. If the BPL 600 does not exist, as will be described below, an excessive tensile stress may be applied, when the substrate 100 is bent, to the first conductive layer 215c in the bending area BA because the first conductive layer 215c need not be in the stress neutral plane.

The location of the stress neutral plane may be adjusted to be around the first conductive layer 215c by forming the BPL 600. For example, the thickness and modulus of the BPL 600 may be controlled so that the location of the stress neutral plane in the stack structure including the substrate 100, the first conductive layer 215c, the BPL 600, etc. may be around the first conductive layer 215c. Accordingly, a tensile stress applied to the first conductive layer 215c may be minimized, thereby protecting a bending portion in the bending area BA.

The BPL 600 is in contact with the polarization plate 520 without covering the polarization plate 520 as shown in FIG. 7. The present invention is not limited thereto. For example, an end of the BPL 600 may partially cover an upper surface at an edge of the polarization plate 520. For example, the end of the BPL 600 in the direction (the −x direction) toward the display area DA need not contact the polarization plate 520 and/or a light-transmitting adhesive 510.

The BPL 600 may be formed by applying and hardening a liquid phase material or a paste-type material. The volume of the BPL 600 may be reduced during a hardening process. The BPL 600 is in contact with the polarization plate 520 and/or the light-transmitting adhesive 510 to the extent that the BPL 600 is fixed at the boundary between the BPL 600 and the polarization plate 520, and thus, the volume reduction occurs in the remaining portion of the BPL 600 which is not in contact with the polarization plate 520. As a result, a thickness of the portion of the BPL 600 in the direction (−x direction) toward the display area DA may be greater than thicknesses of the remaining portions of the BPL 600.

Figure 8:
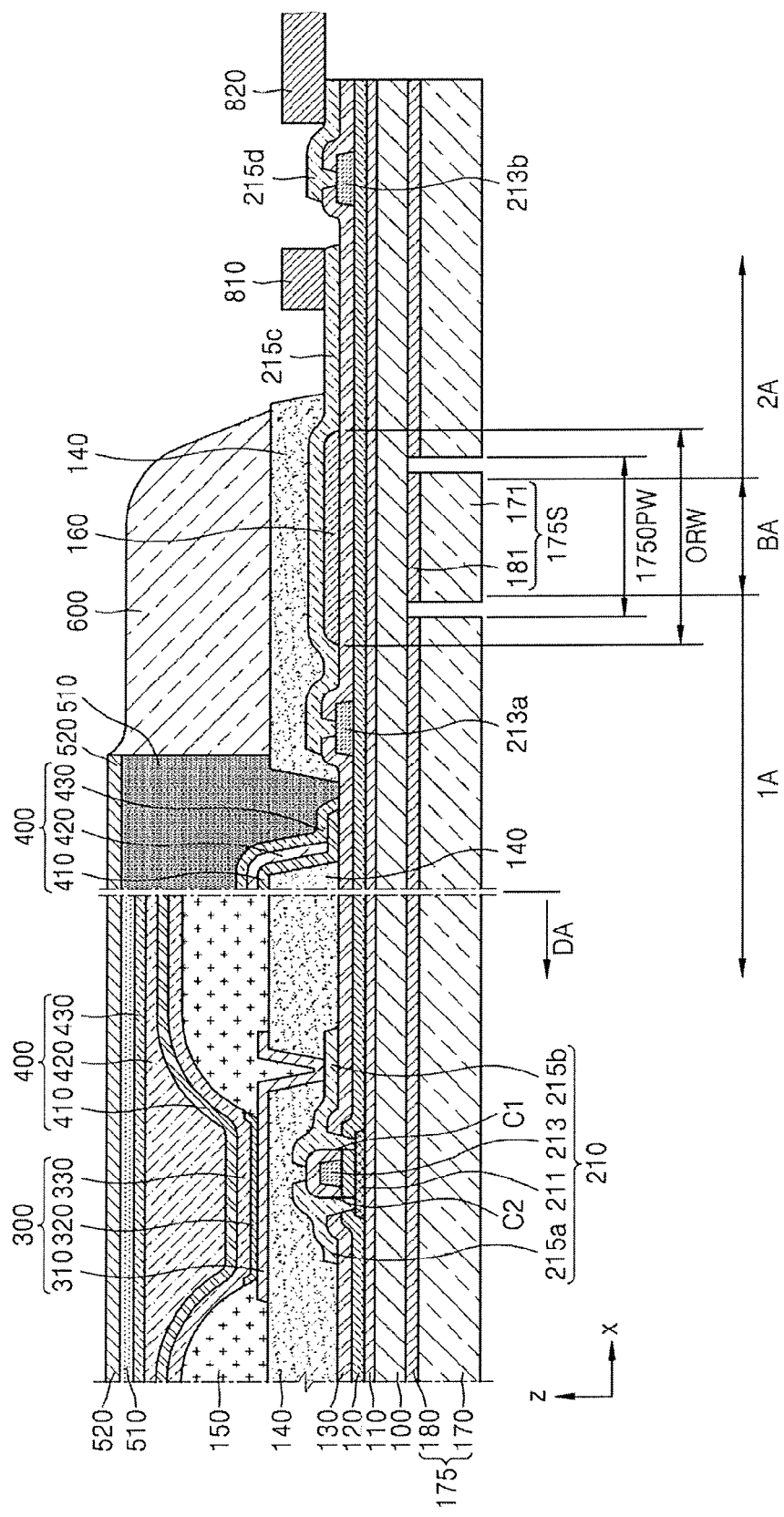

Referring to FIGS. 8 and 9, the lower film 195 and the support film 175S attached to the lower surface of the substrate 100 are removed. For example, the lower film 195 may be separated and removed from the protection film 175 and the support film 175S and then the support film base 171 that is a part of the support film 175S is removed.

The support base film 171 may be removed by using an isolation tape. In this case, an adhesive force of the isolation tape may be higher than an adhesive force of the second adhesive layer 181 to the extent that the support film base 171 may be more strongly combined with the isolation tape than the support film base 171 is attached to the substrate 100 by using the second adhesive layer 181. Accordingly, when the isolation tape is pulled off from the support film base 171, the support film base 171 may be separated from the substrate 100. In this case, the second adhesive layer 181 remains on the lower surface of the substrate 100. The present invention is not limited thereto. For example, at least a part of the second adhesive layer 181 may be separated from the support film base 171, remaining on the lower surface of the substrate 100. in this case, only a part of the second adhesive layer 181 may be detached along with the support film base 171.

Figure 9B:
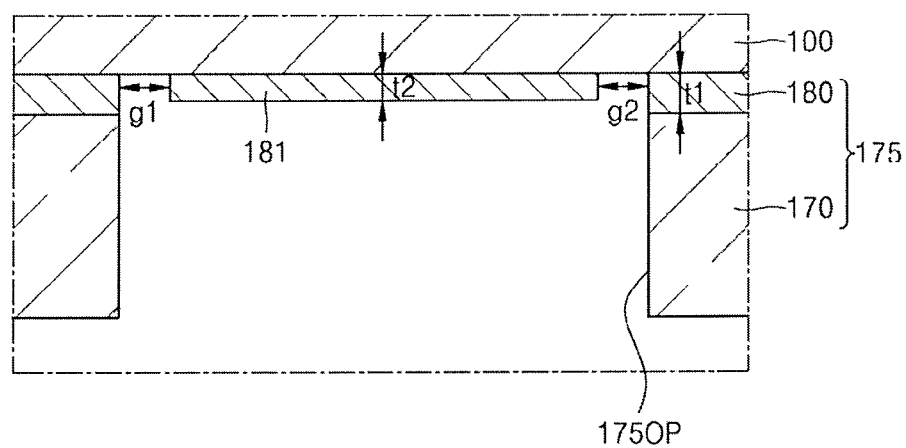
Figure 9C:
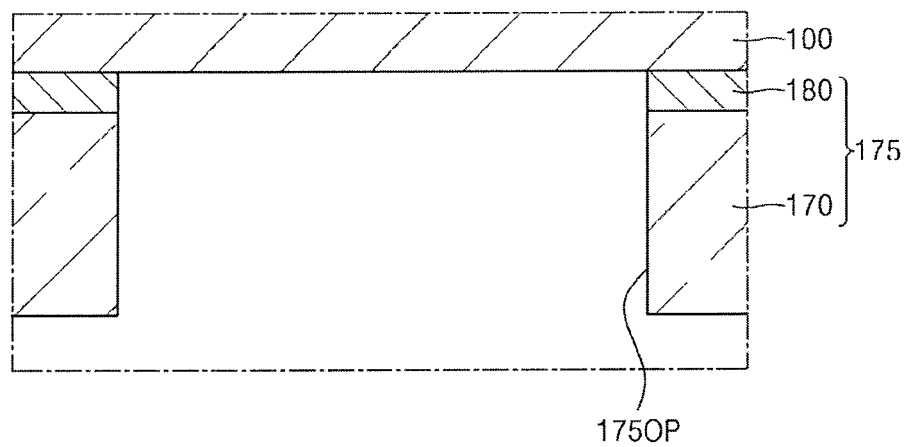

FIGS. 9B and 9C are enlarged views of part A of FIG. 9A and illustrate various shapes of an inner portion of the opening 175OP of the protection film 175. Referring to FIG. 9B, a thickness t2 of at least a part of the second adhesive layer 181 is smaller than a thickness t1 of the first adhesive layer 180. The thickness difference may be made when only a part of the second adhesive layer 181 is detached in a thickness direction when the support film base 171 is detached or a thickness of the second adhesive layer 181 may be smaller than that of the first adhesive layer 180 before the support film 170s is attached to a lower surface of the substrate 100.

Referring to FIG. 9C, the second adhesive layer 181 does not remain in an inner portion of the opening 175OP of the protection film 175. In this case, the second adhesive layer 181 and the support film base 171 completely removed. In an exemplary embodiment, the second adhesive layer 181 need not be formed before the support film 170S is attached to the lower surface of the substrate 100.

As described with reference to FIGS. 8 and 9A, the lower film 195 and the support film base 171 are sequentially removed. The present invention is not limited thereto. For example, the lower film 195 and the support film base 171 may be simultaneously removed. In this case, adhesion of the second adhesive layer 181 may be weaker than adhesion of the first adhesive layer 180 and adhesion of the third adhesive layer 191. The second adhesive layer 181 may include a material having a different adhesion characteristic from a material of the first adhesive layer 180. The second adhesive layer 181 may include the same material as a material of the first adhesive layer 180 and may have a different adhesion characteristic from adhesion characteristic of the first adhesive layer 180 by performing later a process of weakening the adhesion of the second adhesive layer 181. The adhesion of the first adhesive layer 180 may be the same as or stronger than that of the third adhesive layer 191.

For example, the adhesion of the second adhesive layer 181 may be weaker than the adhesion of the first adhesive layer 180 by irradiating ultraviolet (UV) rays on the second adhesive layer 181. For reference, the adhesion of a PSA may be generally weakened when UV rays are irradiated thereon. The amplitude of the UV rays irradiated to the second adhesive layer 181 so as to weaken the adhesion of the second adhesive layer 181 may be less than the amplitude of the UV rays irradiated to the first adhesive layer 180 so as to increase hardness of a specific part of the second adhesive layer 181, which will be described later.

As described above, when the adhesion of the second adhesive layer 181 is weaker than the adhesion of the third adhesive layer 191, the support film base 171 may be removed simultaneously with the lower film 195 using an isolation tape. The present invention is not limited thereto. For example, the support film base 171 may be removed by irradiating a laser beam or by an etching process.

After the lower film 195 and the support film base 171 are removed, the substrate 100, etc. may be bent in the bending area BA to have a resulting structure as shown in FIG. 1.

Hereinafter, it will be described that the second adhesive layer 181 remains in the opening 175OP of the protection film 175 for the convenience of description. The description that will be made below may be also applicable when as described with reference to FIGS. 9B and 9C, the second adhesive layer 181 is partially disposed or is not disposed.

Figure 10:
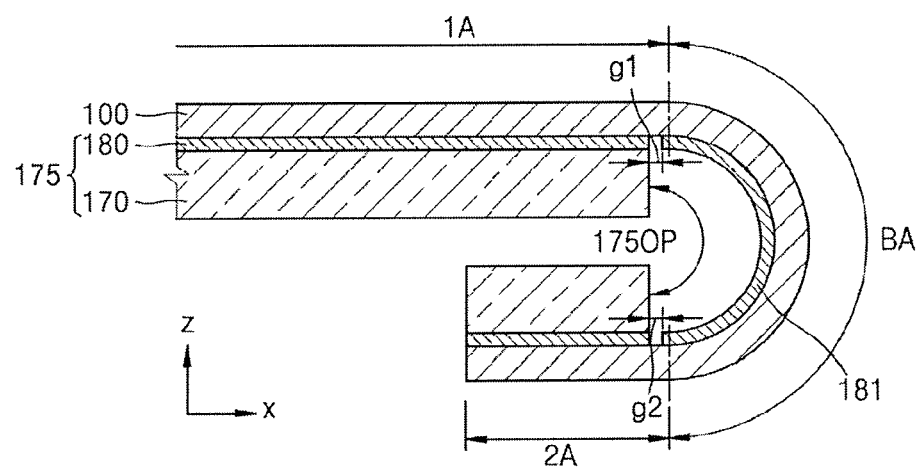

FIG. 10 is a schematic cross-sectional view of the substrate 100 and the protection film 175 of the display apparatus of FIG. 1. The substrate 100 is in the status of being bent in the bending area BA. The protection film base 170 of the protection film 175 may have rigidity sufficient to protect a lower surface of the substrate 100 in the process of bending the substrate 100. However, if the protection film has the rigidity sufficient to protect the lower surface of the substrate 100, the protection film base 170, if not having the opening 175OP, may be separated from the substrate 100 in the process of bending the substrate 100. The opening 175OP overlapping the bending area BA may prevent the protection film base 170 from being separated from the substrate 100 in the process of bending the substrate 100.

The bending area BA has a curved surface along a longitudinal direction of the opening 175OP. For example, the bending area BA has a lower curved surface along the longitudinal direction of the opening 175OP.

The second adhesive layer 181 is disposed in the opening 175OP, spaced apart from the first adhesive layer 180 by the predetermined gaps g1 and g2. For example, the second adhesive layer 181 overlaps the bending area BA.

Hardness of the second adhesive layer 181 may be adjusted after the second adhesive layer 181 is bent in the process of bending the substrate 100. The hardness of the second adhesive layer 181 may be adjusted by using various methods. For example, an UV ray or a laser beam may be irradiated to the second adhesive layer 181 or a heat treatment process may be applied to the second adhesive layer 181. For reference, a general PSA has increased hardness when an UV ray or a laser beam is irradiated or heat is applied thereto. Accordingly, the hardness of the second adhesive layer 181 may be greater than the hardness of the first adhesive layer 180. The second adhesive layer 181 may have the increased hardness to the extent that the substrate 100 bent after the process of bending the substrate 100 keeps the bent shape of FIG. 10. For example, the second adhesive layer 181 may have the increased hardness sufficient to prevent or minimize returning of the substrate 100 to a state before being bent. For example, the second adhesive layer has a hardness to the extent that the substrate is prevented from losing a curved surface formed after the bending area BA is bent.

Since the UV ray or the laser beam is irradiated to the second adhesive layer 181, adhesion and/or a color of the second adhesive layer 181 may also be changed differently from adhesion and/or a color of the first adhesive layer 180.

Figure 11:
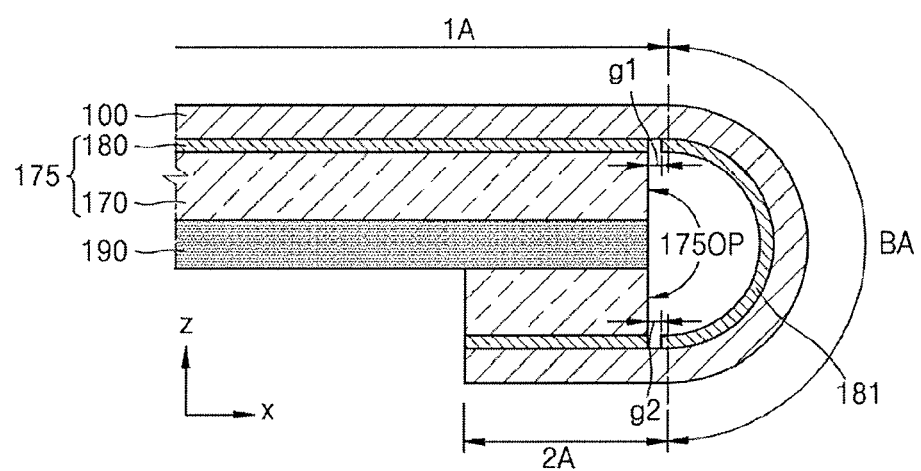

In FIG. 11, a cushion layer 190 is formed in an area between the first area 1A and the second area 2A. For example, the cushion layer 190 is in contact with a part of the first area 1A and a part of the second area 2A of the protection film base 170. The cushion layer 190 fills a space between the first area 1A and the second area 2A to support a display panel and buffer an external shock applied to the substrate 100. The cushion layer 190 may include an elastic material to the extent that the cushion layer 190 protects the substrate 100 from the external shock by absorbing the external shock. According to an exemplary embodiment, the cushion layer 190 may be formed of polyurethane or other polymer to absorb the external shock.

Figure 12:
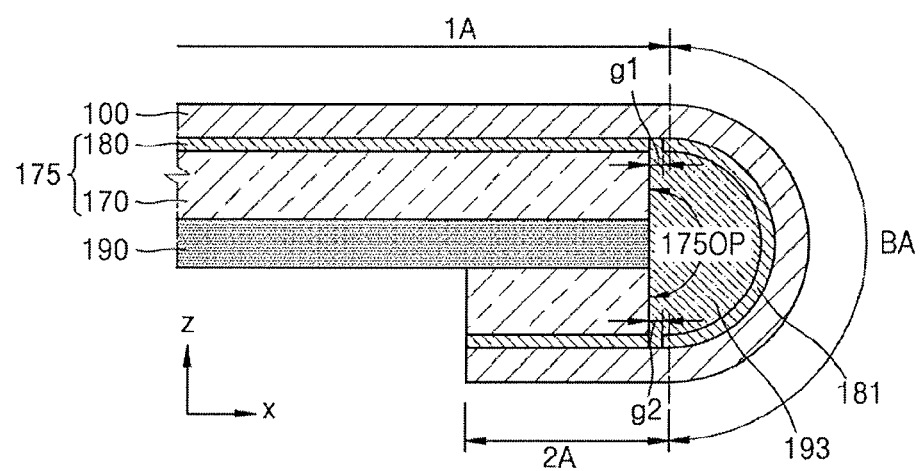

In FIG. 12, a filler 193 is formed in the opening 175OP of the protection film 175. The filler 193 may be formed by injecting and hardening a liquid phase material or a paste-type material into the opening 175OP of the protection film 175. The filler 193 may be hardened by irradiating an UV ray or applying a heat treatment thereto. The filler 193 may include a material having adhesion. Since the filler 193 is hardened by irradiating the UV ray or applying heat, deformation of the substrate 100 by restoring force that restores the substrate 100 to a state before being bent may be effectively prevented or minimized in collaboration with the second adhesive layer 181. If the second adhesive layer 181 does not exist in the opening 175OP, the filler 193 may prevent or minimize the returning of the substrate 100 to a state before being bent. Hereinafter, the hardening process performed on the filler may be referred to as a second hardening process.

Figure 13A:
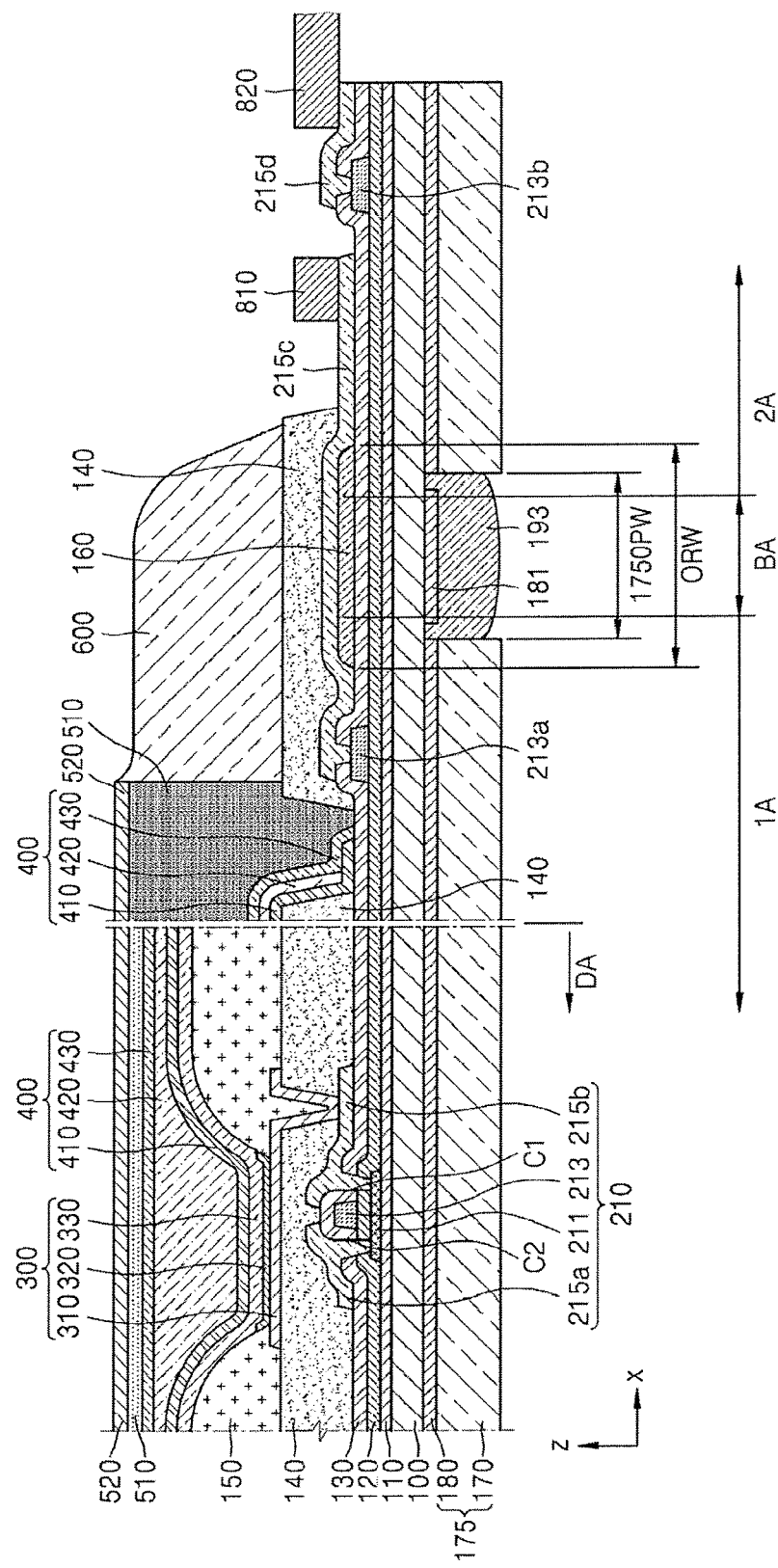
FIGS. 13A through 13C are schematic cross-sectional views for describing processes of manufacturing a display apparatus according to an exemplary embodiment of the present invention.
Figure 13B:
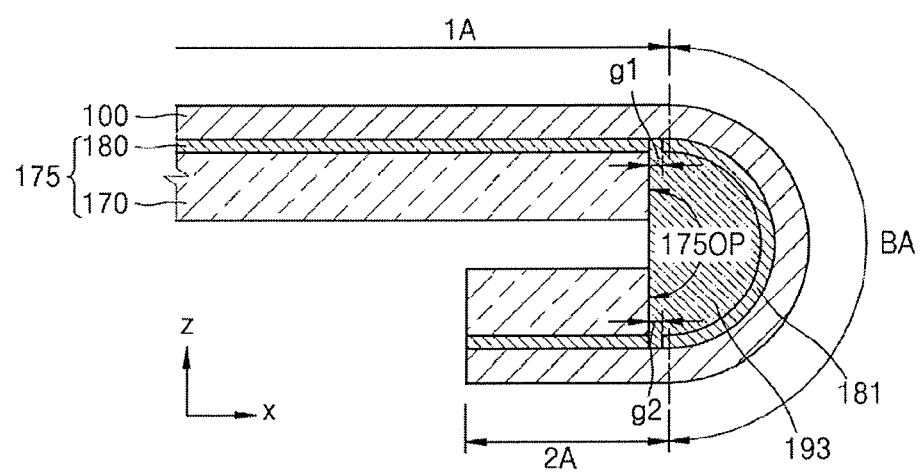
Figure 13C:
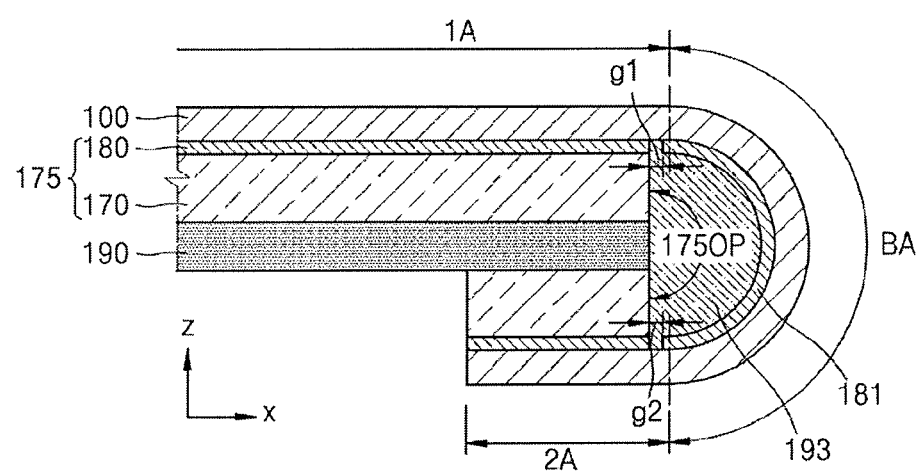

The filler 193 is injected after the substrate 100, etc. is bent in FIG. 12. The present invention is not limited thereto. For example, as shown in FIGS. 13A through 13C, after the support film base 171 is removed and then a liquid phase or paste-type filler 193 is injected (FIG. 13A) and before the liquid phase or paste-type filler 193 is hardened, the substrate 100, etc. may be bent as shown in FIG. 13B. Thereafter, the liquid phase filler 193 may be hardened to form the filler 193 by a second hardening process including irradiating an UV ray or applying heat to the liquid phase filler 193. For example, as shown in FIG. 13C, the cushion layer 190 may be disposed and then the liquid phase filler 193 may be hardened. According to an exemplary embodiment, the liquid phase filler 193 may be formed of acryl-based polymer. The liquid pahse filler 193 may also include a hardner.

Figure 14A:
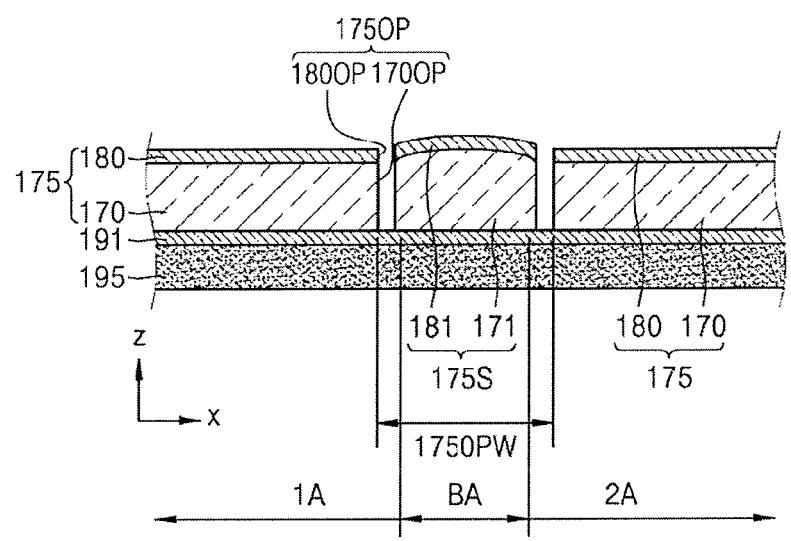
FIGS. 14A through 14D are schematic cross-sectional views of a support film that may be applied to a display apparatus according to an exemplary embodiment of the present invention.

FIGS. 14A through 14D are schematic cross-sectional views of a shape of the support film 175S according to an exemplary embodiment. Referring to FIG. 14A, a surface of the support film 175S attached to the substrate 100 may have a convex shape in a direction (+z direction) of an upper surface of the substrate 100. For example, an upper surface of the support film 175S has the convex shape.

Since the upper surface of the 175S has the convex shape, an inorganic insulating layer and a conductive layer formed in the bending area BA of the substrate 100 may have convex shapes before the substrate 100 is bent, thereby minimizing cracks that may occur when the substrate 100 is bent.

In some embodiments, the upper surface of the support film 175S may have a uniform radius of curvature with respect to a bending axis. In some embodiments, a first radius of curvature of the upper surface of the support film 175S with respect to the bending axis may be greater than a second radius of curvature of the substrate 100. Accordingly, after the substrate 100 is bent, the bending area BA may have a curved shape with the second radius of curvature.

Figure 14B:
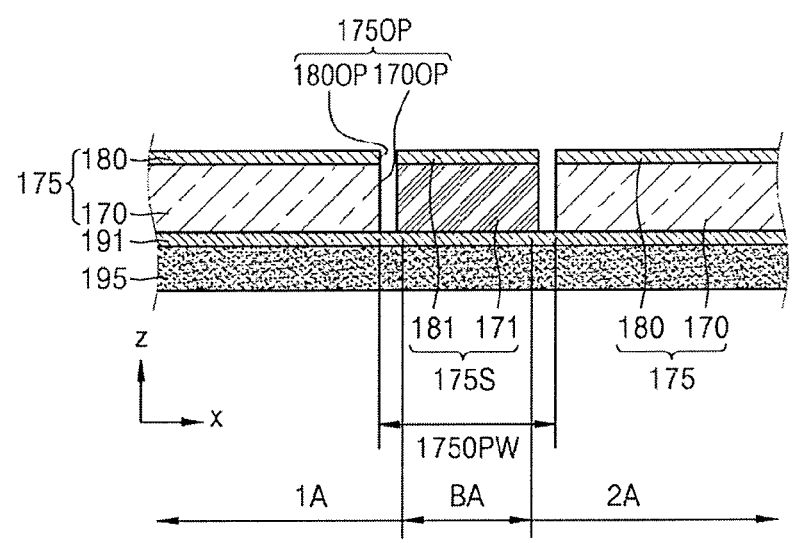

As shown in FIG. 14B, the support film 175S may include a different material from a material of the protection film 175. In this case, after the opening 175OP of the protection film 175 is formed, the support film 175S may be inserted into the opening 175OP.

Figure 14C:
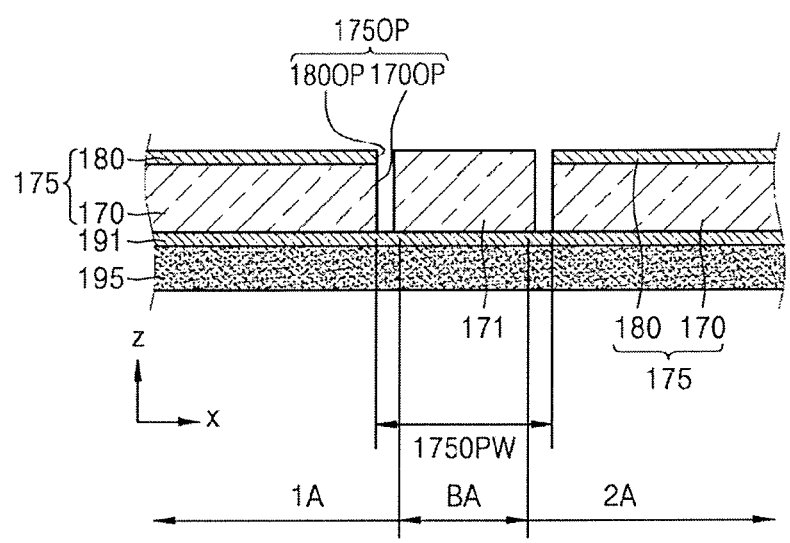
Figure 14D:
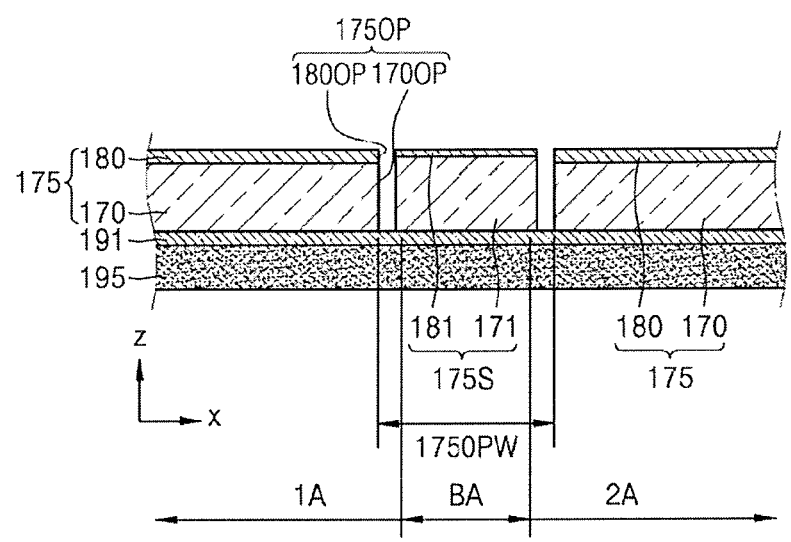

Various modifications may be made such as the support film 175S may be configured as only the support film base 171 as shown in FIG. 14C, and the second adhesive layer 181 of the support film 175S may have a smaller thickness than that of the first adhesive layer 180 of the protection film 175 as shown in FIG. 14D. In this case, the support film base 171 may include the same material as or a different material from a material of the protection film base 170.

In FIGS. 14B through 14D, the upper surface of the support film 175S is flat. The present invention is not limited thereto. For example, the upper surface of the support film 175S may have the convex shape as shown in FIG. 14A.

Figure 15:
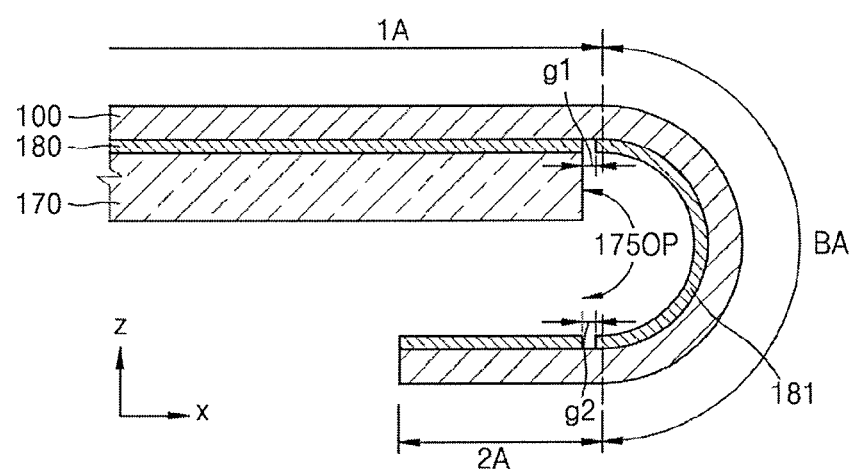
FIG. 15A is a schematic cross-sectional view partially showing a display apparatus according to an exemplary embodiment of the present invention.
FIG. 15B is a schematic cross-sectional view of a support film that may be applied to manufacture the display apparatus of FIG. 15.

A case where the protection film 175 includes the opening 175OP corresponding to the bending area BA and is attached to a lower surface of the substrate 100 in the first area 1A and the second area 2A is described above but the inventive concept is not limited thereto. For example, the protection film 175 may correspond to only at least a part of the first area 1A of the substrate 100. For example, as shown in FIG. 15A that is a schematic cross-sectional view of a part of a display apparatus according to an exemplary embodiment, the protection film 175 is not be formed in the second area 2A of the substrate 100.

For example, as shown in FIG. 15B, the protection film 175 is formed on the first area 1A, and the support film 175S is formed on the bending area BA and the second area 2A. The support film base 171 may be removed before the substrate 100, etc. is bent, and then the substrate 100, etc. may be bent in the bending area BA. Accordingly, the structure shown in FIG. 15A may be obtained after the substrate 100 is bent. In this case, the second adhesive layer 181 is spaced apart from the first adhesive layer 180 by the predetermined gap g1 and disposed in the bending area BA and the second area 2A. As described above, the second adhesive layer 181 may have a different property from a property of the first adhesive layer 180. For example, the second adhesive layer 181 may be different from the first adhesive layer 180 in adhesion, hardness, or colors, etc. In the display apparatus according to the present embodiment, the filler 193 and/or the cushion layer 190 described above may also be formed.

The substrate 100 is bent along a bending axis so that a part of a lower surface of the first area 1A and at least a part of a lower surface of the second area 2A face each other in FIGS. 1, 10 through 12, 13B, 13C, and 15. The present invention is not limited thereto. For example, the substrate 100 may be bent to the extent that the lower surface of the second area 2A need not face the lower surface of the first area 1A. In this case, a curvature of the bending area BA is smaller than the curvature of the bending area as shown in FIGS. 1, 10 through 12, 13B, 13C, and 15 or an area of the bending area BA may be small.

Figure 16:
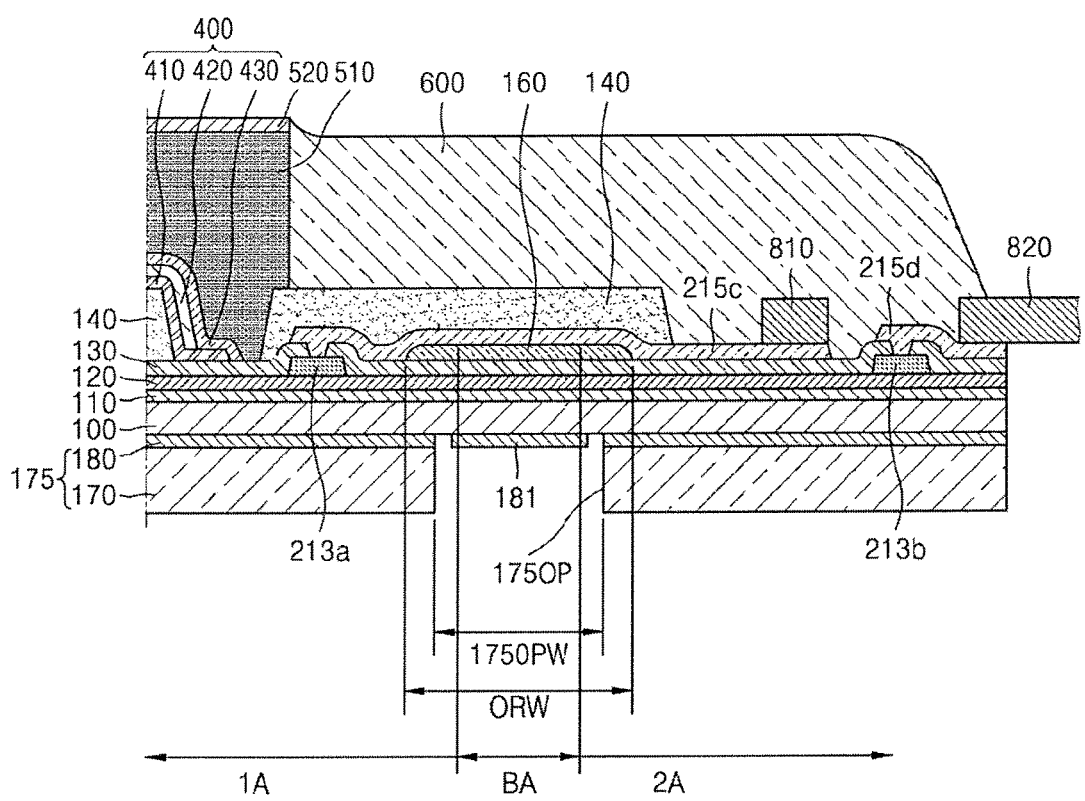
FIG. 16 is a schematic cross-sectional view partially showing a display apparatus according to an exemplary embodiment of the present invention.

In FIG. 16, the BPL 600 may extend to an end of the substrate 100 of a display apparatus, covering the first conductive layer 215*c*, the second conductive layer 213*b*, and/or other conductive layers electrically connected to the first and second conductive layers 215*c* and 213*b* which are not covered at least partially by the interlayer insulating layer 130 or the planarization layer 140, etc. but may be electrically connected to the driving circuit chip 810 or the PCB 820, etc. The electrically connected portions covered by the BPL 600 may be protected from impurities such as external moisture. In this case, the BPL 600 may serve as a protection layer of the electrically connected portions. The BPL 600 also covers the driving circuit chip 810 and a part of the PCB 820. The present invention is not limited thereto. For example, the BPL 600 may cover the driving circuit chip 810 without covering the PCB 820. According to an exemplary embodiment, the BPL 600 may be formed of acryl-based polymer.

Figure 17A:
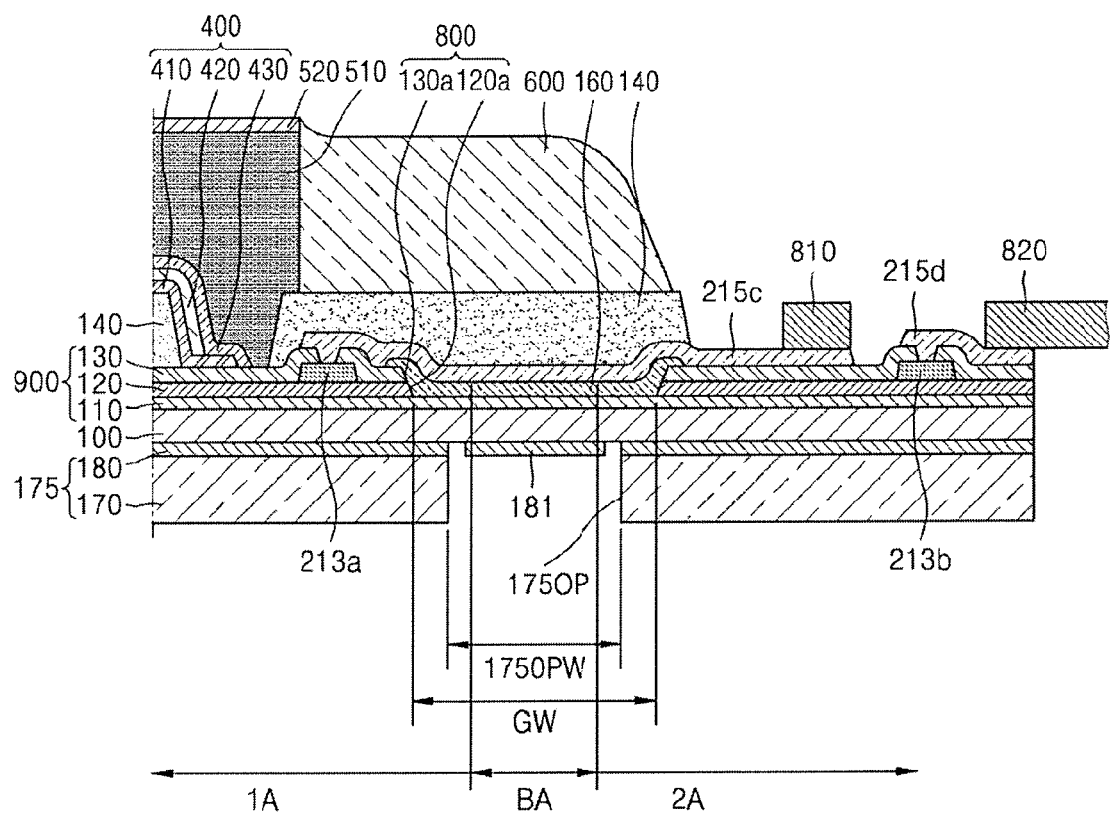
FIG. 17A is a schematic cross-sectional view partially showing a display apparatus according to an exemplary embodiment of the present invention.

FIG. 17A is a schematic cross-sectional view partially showing a display apparatus according to an exemplary embodiment. FIG. 17A is a schematic cross-sectional view of a periphery of the bending area BA. The inorganic insulating layer 900 including the buffer layer 110, the gate insulating layer 120 and the interlayer insulating layer 130 may include a groove 800 at a location corresponding to the bending area BA.

The buffer layer 110 is continuously formed throughout the first area 1A, the bending area BA, and the second area 2A. The gate insulating layer 120 has an opening 120*a* corresponding to the bending area BA. The interlayer insulating layer 130 has an opening 130*a* corresponding to the bending area BA. Accordingly, the inorganic insulating layer 900 including the buffer layer 110, the gate insulating layer 120, and the interlayer insulating layer 130 have a groove 800 formed of the openings 120*a* and 130*a*. The groove 800 is formed on the bending area BA so that the groove 800 overlaps the bending area BA.

The inorganic insulating layer 900 may include a groove of a different type. For example, an upper surface of the buffer layer 110 (in +z direction) may be partially removed, or a lower surface of the gate insulating layer 120 (in −z direction) may remain. With reference to FIGS. 17A and 3, the groove 900 may be formed simultaneously with a patterning process for forming the contact holes C1 and C2 for connecting the source electrode 215*a* and the drain electrode 215*b* of the TFT 210 to the semiconductor layer 211.

Referring back to FIG. 17A, an area of the groove 800 may be greater than an area of the bending area BA. In this case, a width GW of the groove 800 is shown to be greater than a width of the bending area BA in FIG. 17A. In this regard, the area of the groove may be defined as an area of the opening having the smallest area, between the openings 120a and 130a in the gate insulating layer 120 and the interlayer insulating layer 130. For example, the area of the groove 800 is defined by the area of the opening 120a in the gate insulating layer 120. In the display apparatus according to the present embodiment, the organic material layer 160 may be disposed between the inorganic insulating layer and the first conductive layer 215c and may fill the groove 800.

Although FIG. 17A shows that the display apparatus is not bent for convenience of description, the display apparatus according to an exemplary embodiment may be in a state in which the substrate 100, etc. is bent in the bending area BA as shown in FIG. 1. During manufacturing processes, the display apparatus may be manufactured in a state in which the substrate 100 is flat, and then, the substrate 100, etc. may be bent in the bending area BA so that the display apparatus may have the shape as shown in FIG. 1. In this regard, a tensile stress may be applied to the first conductive layer 215c while the substrate 100, etc. is bent at the bending area BA, but in the display apparatus according to an exemplary embodiment, the inorganic insulating layer 900 may have the groove 800 in the bending area BA, and a portion of the first conductive layer 215c that corresponds to the bending area BA may be located on the organic material layer 160 at least partially filling the groove in the inorganic insulating layer 900. Accordingly, the occurrence of cracks in the portion of the first conductive layer 215c that corresponds to the bending area BA may be prevented or minimized. The first conductive layer 215c is located on the organic material layer 160.

Since the inorganic insulating layer 900 has a higher hardness than the organic material layer 160, the inorganic insulating layer 900 in the bending area BA is highly likely to have cracks. When the inorganic insulating layer cracks, there is a high possibility that the cracks may spread to the first conductive layer 215c. Although the organic material layer 160 may block the cracks from spreading, the groove formed in the inorganic insulating layer may further reduce the possibility of the inorganic insulating layer having cracks. Therefore, a minimum amount of tensile stress may concentrate on the first conductive layer 215c.

Figure 17B:
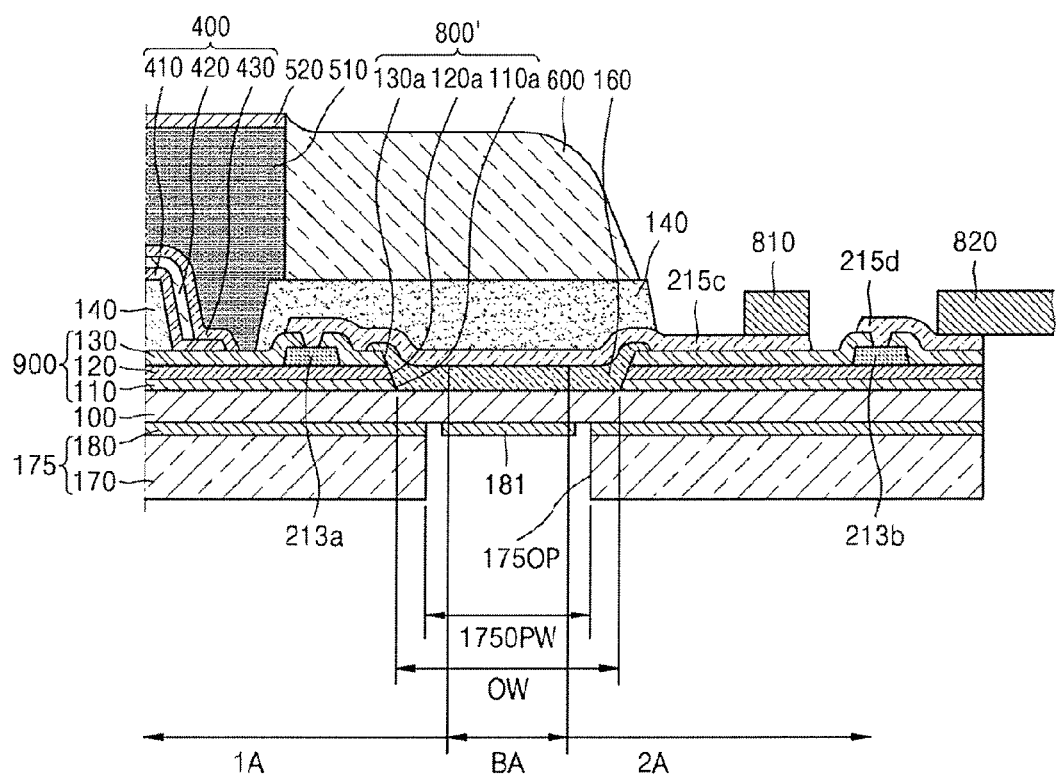
FIG. 17B is a schematic cross-sectional view partially showing a display apparatus according to an exemplary embodiment of the present invention.

FIG. 17B is a schematic cross-sectional view partially showing a display apparatus according to an exemplary embodiment. Referring to FIG. 17B, an inorganic insulating layer 900 includes an opening 800' at a location corresponding to the bending area BA. For example, the opening 800' overlap the bending area BA or the second adhesive layer 181.

Referring to FIG. 17B, the buffer layer 110, the gate insulating layer 120, and the interlayer insulating layer 130 may respectively have the openings 110a, 120a, and 130a corresponding to the bending area BA. That an opening 800' overlaps the bending area BA or the second adhesive layer 181. In this regard, an area of the opening may be greater than that of the bending area BA. For example, the width GW of the opening is shown to be greater than a width of the bending area BA in FIG. 17B. In this regard, the area of the opening may be defined as an area of the opening having the smallest area, between the openings 110a, 120a, and 130a in the gate insulating layer 120 and the interlayer insulating layer 130. For example, in FIG. 17B, the area of the opening is defined by the area of the opening 110a in the buffer layer 110.

When a display portion described above is formed, the organic material layer 160 filling at least a part of the opening 800' of the inorganic insulating layer 900 may be formed. The inorganic insulating layer 900 has the opening 800' in the bending area BA, and a portion of the first conductive layer 215c that corresponds to the bending area BA may be located on the organic material layer 160 at least partially filling the opening 800' in the inorganic insulating layer 900. Since the inorganic insulating layer 900 has the opening 800' in the bending area BA, there is a very low possibility that cracks occur in the inorganic insulating layer 900. Due to a characteristic of the organic material layer 160 including an organic material, there is a low possibility that cracks occur in the organic material layer 160. Thus, the occurrence of cracks in the portion of the first conductive layer 215c that corresponds to the bending area BA, wherein the first conductive layer 215c is located on the organic material layer 160, may be prevented or minimized. Since the organic material layer 160 has a lower hardness than the inorganic insulating layer 900, the organic material layer 160 may buffer a tensile stress generated by bending the substrate 100, etc., thereby effectively minimizing an amount of the tensile stress that concentrates on the first conductive layer 215c.

Figure 17C:
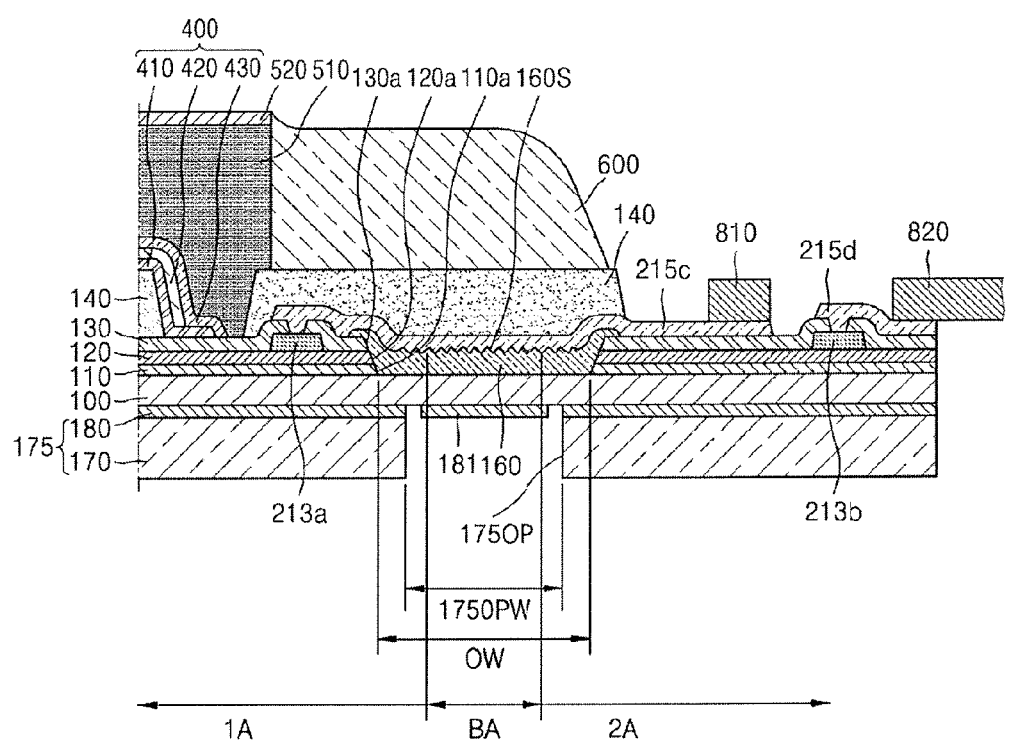
FIG. 17C is a schematic cross-sectional view partially showing a display apparatus according to an exemplary embodiment of the present invention.

FIG. 17C is a schematic cross-sectional view partially showing a display apparatus according to an exemplary embodiment. Referring to FIG. 17C, the organic material layer 160 may have a corrugated surface 160s at least partially in an upper surface thereof (+z direction). Since the organic material layer 160 includes the corrugated surface 160s, the first conductive layer 215c located on the organic material layer 160 may have an upper surface and/or a lower surface having a shape corresponding to the corrugated surface 160s of the organic material layer 160.

As described above, since tensile stress may be applied to the first conductive layer 215c when the substrate 100, etc. is bent at the bending area BA during a manufacturing process, the upper surface and/or the lower surface of the first conductive layer 215c may have the shape corresponding to the corrugated surface 160s of the organic material layer 160, and thus an amount of the tensile stress applied to the first conductive layer 215c may be minimized. That is, the tensile stress which may be generated during a bending process may be reduced via deformation of the shape of the organic material layer 160 having a smaller hardness. In this regard, the first conductive layer 215c having a corrugated shape at least before the bending process is performed may be deformed with the organic material layer 160 in the bending process. Accordingly, the occurrence of a defect such as a disconnection in the first conductive layer 215c may be prevented.

The corrugated surface 160s may be formed at least partially in the upper surface of the organic material layer 160 (+z direction), and thus, a surface area of the upper surface of the organic material layer 160 and a surface area of the upper and lower surfaces of the first conductive layer 215c in a first opening may be increased. Increased surface areas of the upper surface of the organic material layer 160 and the upper and lower surfaces of the first conductive layer 215c increase a deformation margin so that the tensile stress caused due to the bending of the substrate 100 may be reduced.

For reference, since the first conductive layer 215c is located over the organic material layer 160, the lower surface of the first conductive layer 215c may have a shape corresponding to the corrugated surface 160s of the organic material layer 160. However, the present invention is not limited thereto. For example, the upper surface of the first conductive layer 215c may have a corrugate surface which does not match with the corrugated surface 160s of the organic material layer 160.

The description may be applied to an example in which an inorganic insulating layer having an corrugated surface includes an opening, an example in which the inorganic insulating layer has a flat upper surface at an area overlapping the organic material layer 160, and an example in which the inorganic insulating layer has a groove.

In a display apparatus according to the above-described embodiments, structures, manufacturing methods, and features that are described in the above-described embodiments regarding the protection film 175 including the protection film base 170 and the first adhesive layer 180 and the second adhesive layer 181 may be applied.

When the organic material layer 160 is not formed, structures, manufacturing methods, and features that are described in the above-described embodiments regarding the protection film 175 including the protection film base 170 and the first adhesive layer 180 and the second adhesive layer 181 may also be applied.

In one or more embodiments, a plurality of display panels are formed by forming a plurality of display portions on a mother substrate and simultaneously cutting the mother substrate and a temporary protection film but one or more embodiments are not limited thereto. For example, the plurality of display panels may not be simultaneously formed but a substrate including a material having a flexible or bendable characteristic may be formed over a carrier substrate and one display portion may be formed on the substrate. Thereafter, various modifications may be made such as the carrier substrate may be removed from the substrate and a protection film and a support film may be attached to a lower surface of the substrate.

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. A method of manufacturing a display apparatus, the method comprising:
    preparing a substrate having a display portion on an upper surface of the substrate;
    attaching a protection film having an opening to a lower surface of the substrate so that the protection film overlaps the display portion;
    attaching a support film to the lower surface so that the support film is disposed within the opening of the protection film, wherein the support film is spaced apart from the protection film before the support film is attached to the lower surface;
    attaching a driving circuit chip to the upper surface so that the driving circuit chip is spaced apart from the display portion and the opening;
    removing at least a part of the support film; and
    bending the substrate along a longitudinal direction of the opening.

2. The method of claim 1,
    wherein the removing of the at least a part of the support film is performed after the attaching of the driving circuit chip is performed.

3. The method of claim 1,
    wherein the support film comprises a support film base and an adhesive layer,
    wherein the adhesive layer is interposed between the substrate and the support film base, and
    wherein the removing of the at least a part of the support film comprises:
    removing the support film base so that the adhesive layer remains attached to the lower surface of the substrate.

4. The method of claim 1, further comprising:
    forming a preparatory protection film on a lower film;
    cutting the preparatory protection film into the protection film and the support film,
    wherein the cutting of the preparatory protection film is performed before the attaching of protection film and attaching of the support film.

5. The method of claim 1,
    wherein the support film comprises a different material from a material of the protection film.

6. The method of claim 1,
    wherein a surface of the support film attached to the substrate is concave toward the substrate.

7. The method of claim 1, further comprising:
    forming a bending protection layer on the upper surface of the substrate so that the bending protection layer overlaps the opening.

8. The method of claim 1, further comprising:
    applying a liquid phase filler in the opening after the removing of the support film; and
    hardening the liquid phase filler after the bending of the substrate.

9. The method of claim 1, further comprising:
    filling at least partially a filler in the opening before the bending of the substrate.

10. The method of claim 1,
    wherein an area of the support film is smaller than an area of the opening.

11. The method of claim 1,
    wherein the protection film comprises a protection film base and a first adhesive layer,
    wherein the support film comprises a support film base and a second adhesive layer, and
    wherein the protection film base and the support film base are respectively attached to the lower surface of the substrate via the first adhesive layer and the second adhesive layer.

12. The method of claim 1, further comprising:
    forming a cushion layer on the protection film after the bending of the substrate, wherein an upper surface of the cushion layer is in contact with a first portion of the protection film and a lower surface of the cushion layer is in contact with a second portion of the protection film, and
    wherein the bending of the substrate is performed to the extent that the first and second portions face each other.

13. The method of claim 1,
    wherein the attaching of the protection film and the attaching of the support film are performed at substantially the same time.

14. A method of manufacturing a display apparatus, the method comprising:
    preparing a substrate having a display portion on an upper surface of the substrate;
    attaching a protection film having an opening to a lower surface of the substrate so that the protection film overlaps the display portion, wherein the protection film comprises a protection film base and a first adhesive layer;

attaching a support film to the lower surface so that the support film is disposed within the opening of the protection film, wherein the support film comprises a support film base and a second adhesive layer;

attaching a driving circuit chip to the upper surface of the substrate so that the driving circuit chip is spaced apart from the display portion and the opening;

removing the support film to expose the second adhesive layer so that the second adhesive layer is exposed through the opening of the protection film;

bending the substrate along a longitudinal direction of the opening so that the substrate has a curved surface overlapping the opening of the protection film; and performing a first hardening process on the exposed second adhesive layer.

15. The method of claim 14,
wherein the first hardening process is performed so that the second adhesive layer has a hardness to the extent that the second adhesive layer after the first hardening process is performed prevents the substrate from losing the curved surface.

16. The method of claim 14,
wherein the substrate further comprises an inorganic insulating layer, a first conductive layer and an organic material layer stacked on each other to form a stacked structure, and
wherein before the removing of the support film is performed, the stacked structure overlaps the support film disposed within the opening of the protection film.

17. The method of claim 14,
wherein the first hardening process includes irradiation of a laser, irradiation of an UV ray or a heat treatment process.

18. The method of claim 16, further comprising:
forming a groove in the inorganic insulating layer,
wherein the organic material layer fills the groove of the inorganic insulating layer.

19. The method of claim 14, further comprising:
forming a filler on the curved surface of the substrate,
wherein the filler is in contact with the second adhesive layer, and
wherein the filler is hardened by a second hardening process.

20. A method of manufacturing a display apparatus, the method comprising:
preparing a substrate having a display portion on an upper surface of the substrate;
attaching a protection film having an opening to a lower surface of the substrate so that the protection film overlaps the display portion;
attaching a driving circuit chip to the upper surface so that the driving circuit chip is spaced apart from the display portion and the opening;
applying a liquid phase filler in the opening, wherein the liquid phase filler extends across the opening in a first direction; and
bending the substrate along a longitudinal direction of the opening substantially perpendicular to the first direction.

21. The method of claim 20, further comprising:
hardening the liquid phase filler after the bending of the substrate.

* * * * *